United States Patent
Hsueh et al.

(10) Patent No.: US 9,429,835 B2
(45) Date of Patent: Aug. 30, 2016

(54) STRUCTURE AND METHOD OF PHOTOMASK WITH REDUCTION OF ELECTRON-BEAM SCATTERRING

(71) Applicant: Taiwan Semiconductor Manufacturing Company, Ltd., Hs (TW)

(72) Inventors: Wen-Chang Hsueh, Taoyuan County (TW); Chia-Jen Chen, Hsinchu County (TW); Hsin-Chang Lee, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 178 days.

(21) Appl. No.: 14/179,136

(22) Filed: Feb. 12, 2014

(65) Prior Publication Data

US 2015/0227037 A1    Aug. 13, 2015

(51) Int. Cl.
*G03F 1/20* (2012.01)
*G03F 1/22* (2012.01)

(52) U.S. Cl.
CPC ..................... *G03F 1/20* (2013.01)

(58) Field of Classification Search
CPC .................... G03F 1/20; G03F 1/22
See application file for complete search history.

(56) References Cited

U.S. PATENT DOCUMENTS

2013/0260293 A1*  10/2013  Misaka .............. G03F 7/70691
                                              430/5
2014/0038088 A1*  2/2014   Lee .................... G03F 1/22
                                              430/5
2014/0272682 A1    9/2014   Shih et al.

* cited by examiner

*Primary Examiner* — Stephen Rosasco
(74) *Attorney, Agent, or Firm* — Haynes and Boone, LLP

(57) ABSTRACT

The present disclosure provides a structure of a photomask. The photomask includes a substrate; and a conductive material layer dispose over the substrate and patterned to include a plurality of openings and a recess structure surrounding the plurality of openings.

20 Claims, 21 Drawing Sheets

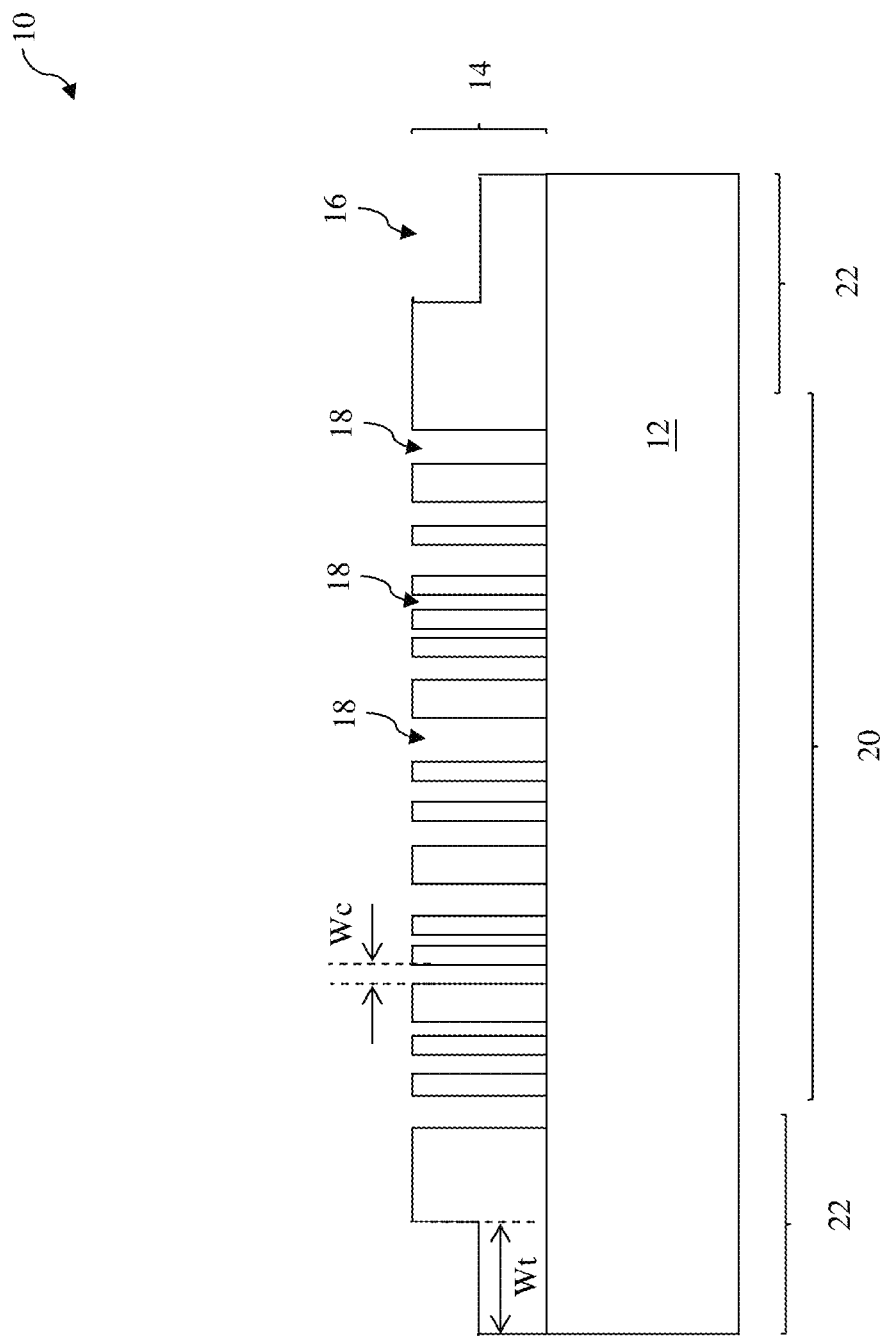

STRUCTURE AND METHOD OF PHOTOMASK WITH REDUCTION OF ELECTRON-BEAM SCATTERRING

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). For example, extreme ultraviolet (EUV) lithography is introduced for patterning smaller features in advanced technology nodes. Photomasks are used in the photolithography patterning and are fabricated using electro-beam (e-beam) writing. However, the second electron scattering reduces contrast and resolution. The degradation of the e-beam writing by the second electron scattering effect is even worse for EUV photomask fabrication.

Therefore, a photomask structure, method making the same and method using the same are needed to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a sectional view of a photomask constructed in accordance with some embodiments.

DETAILED DESCRIPTION

Figure 1:
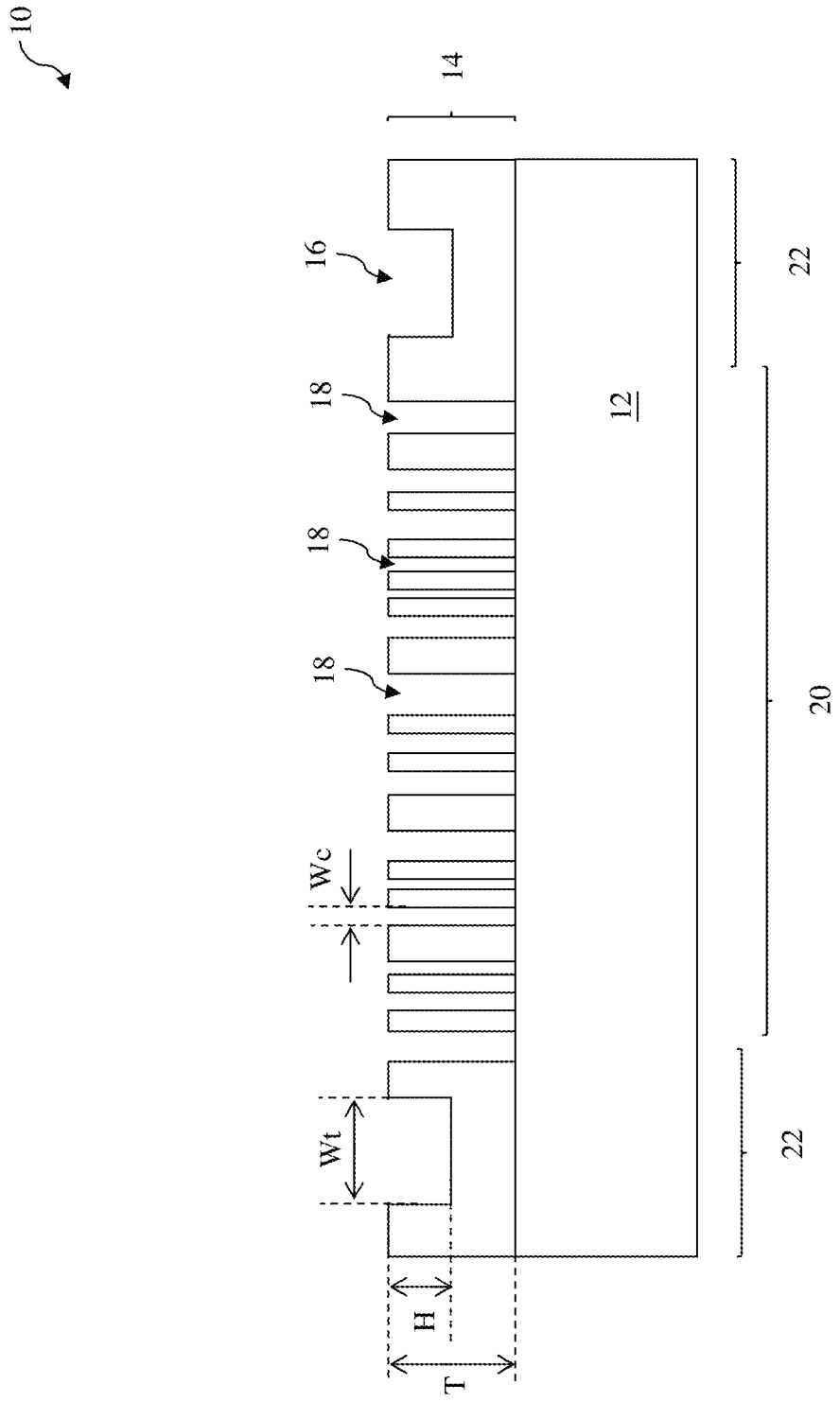
FIG. 1 is a sectional view of a photomask constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
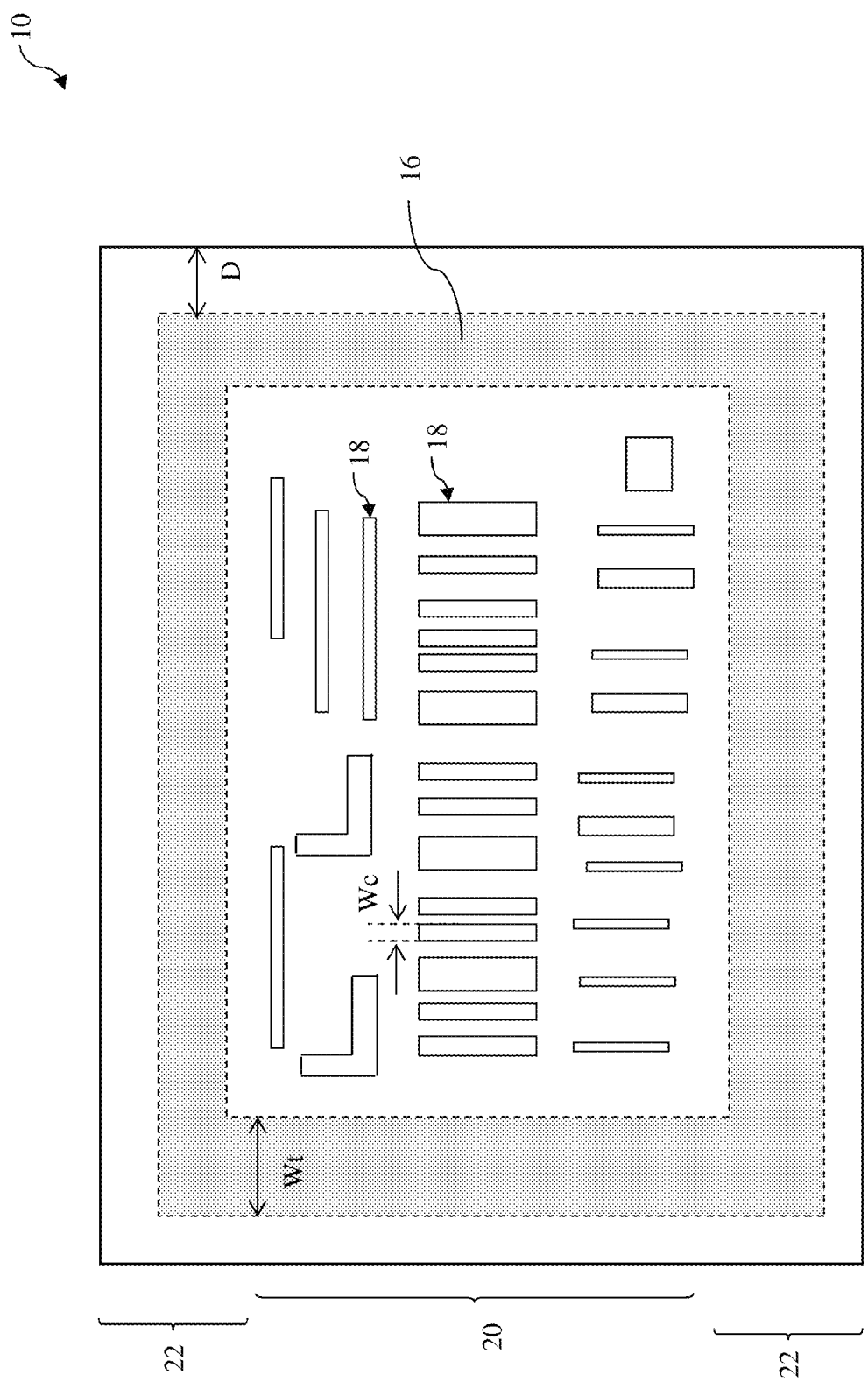
FIG. 2 is a top view of the photomask of FIG. 1 constructed in accordance with some embodiments.

FIG. 1 is a sectional view of a photomask (also referred to as mask or reticle) 10 and FIG. 2 is a top view of the photomask 10, constructed in accordance with some embodiments. The photomask 10 is used to pattern one or more layers during a lithography patterning process. The photomask 10 includes a photomask substrate 12 and a conductive material layer 14 disposed over the substrate 12.

In some embodiments, the photomask 10 is a transmissive photomask used in an ultraviolet (UV), or deep ultraviolet (DUV) lithography process. In furtherance of the embodiments, the substrate 12 includes a transparent substrate, such as fused quartz. In some embodiments, the photomask 10 is a reflective photomask used in an extreme ultraviolet (EUV) lithography process. Such a photomask is also referred to as a EUV photomask. In furtherance of the embodiments, the substrate 12 includes a low thermal expansion material (LTEM), such as TiO2-SiO2 glass.

In some other embodiments, other material layers may be formed between the substrate 12 and the conductive material layer 14. For example where the photomask 10 is a EUV photomask, a reflective multilayer (additionally a capping layer on the reflective multilayer in other example) is formed between the substrate 12 and the conductive material layer 14. In some embodiments, the conductive material layer 14 is an absorption material and is patterned to define an integrated circuit (IC) layout thereon. In some embodiments, the conductive material layer 14 includes a suitable conductive material, such as tantalum boron nitride (TaBN), tantalum boron oxynitride (TaBON), chromium (Cr), or other suitable metal or metal alloy. In other embodiments, the conductive material layer 14 includes more than one conductive material film.

The conductive material layer 14 includes a recess structure 16 and a plurality of openings 18 surrounded by the recess structure 16. The openings 18 are patterned according to an IC layout and define an IC pattern. Therefore, the openings 18 are also collectively referred to as an IC pattern 18 in the following description. The recess structure 16 is designed to reduce the second electron scattering effect during the fabrication of the photomask 10 using electron-beam (e-beam) lithography technology, particularly, during the forming of the IC pattern using the e-beam lithography technology.

The openings (or IC pattern) 18 are to be transferred to a semiconductor substrate, such as a semiconductor wafer. The IC pattern includes various features, such as main circuit features, dummy features and assist features, collectively referred to as polygons. Dummy features are not direct portions of the integrated circuit but are added to enhance the IC fabrication. Assist features include those sub-resolution features, such as optical proximate correction (OPC) assist features, added to enhance imaging effect when the main circuit features are transferred from the photomask to semiconductor wafers by lithography. The recess structure 16 is designed to reduce the second electron scattering effect during an e-beam lithography process. By implementing the recess structure 16 in the photomask 10, the second scattering effect is reduced by restricting the scattered electrons to the bottom portion of the conductive material layer during the e-beam writing process to define the IC pattern 18 in a resist layer coated over the conductive material layer 14.

The recess structure 16 includes a non-through trench formed in the conductive material layer 14. Within the non-through trench, the conductive material layer 14 is thinned but still covers the substrate 12. As illustrated in FIG. 1, the conductive material layer 14 has a thickness T and the non-through trench has a recess height H less than the thickness T. In some embodiments, a ratio defined as H/T ranges between 1/10 and 9/10. The openings 18 are through-trenches defined in the conductive layer 14. Within the through-trenches, the conductive material layer 14 is completely removed.

As illustrated in FIGS. 1 and 2, the non-through trench in the recess structure 16 is configured to surround the IC pattern 18 and includes various segments with a first width Wt. In some embodiments, the first width Wt ranges from about 0.01 mm to about 14.99 mm. The through-trenches in the IC pattern 18 have a second width Wc substantially less than the first width Wt. As noted above, the IC pattern 18 includes various features with a same width or different widths. In the present description, the second width Wc refers to the corresponding width of any main circuit feature in the IC pattern 18. In some embodiments, the second width Wc ranges from about 2 nm to about 50 nm. Particularly, a ratio of the first width over the second width, defined as Wt/Wc, ranges from about 200 to about 8,000,000. In some embodiments, the second width Wc ranges from about 10 nm to less. The ratio Wt/Wc is about 1000 or greater.

In some embodiments, the IC pattern 18 is formed in a circuit region 20 of the photomask 10 and the recess 16 is formed in a frame region 22 of the photomask 10. The frame region 22 may include some other features, such as alignment mark(s), overlay mark(s), test patterns and/or bar codes for identification of photomask, production and manufacturers.

The recess structure 16 may have different configurations. In some embodiments as illustrated in FIG. 2, the recess structure 16 includes a continuous recess feature to encircle the IC pattern 18. The continuous recess feature is disposed to have a distance D to the edges of the photomask 10. In some examples, the edge distance D ranges from about 5 mm to about 15 mm.

Figure 3B:
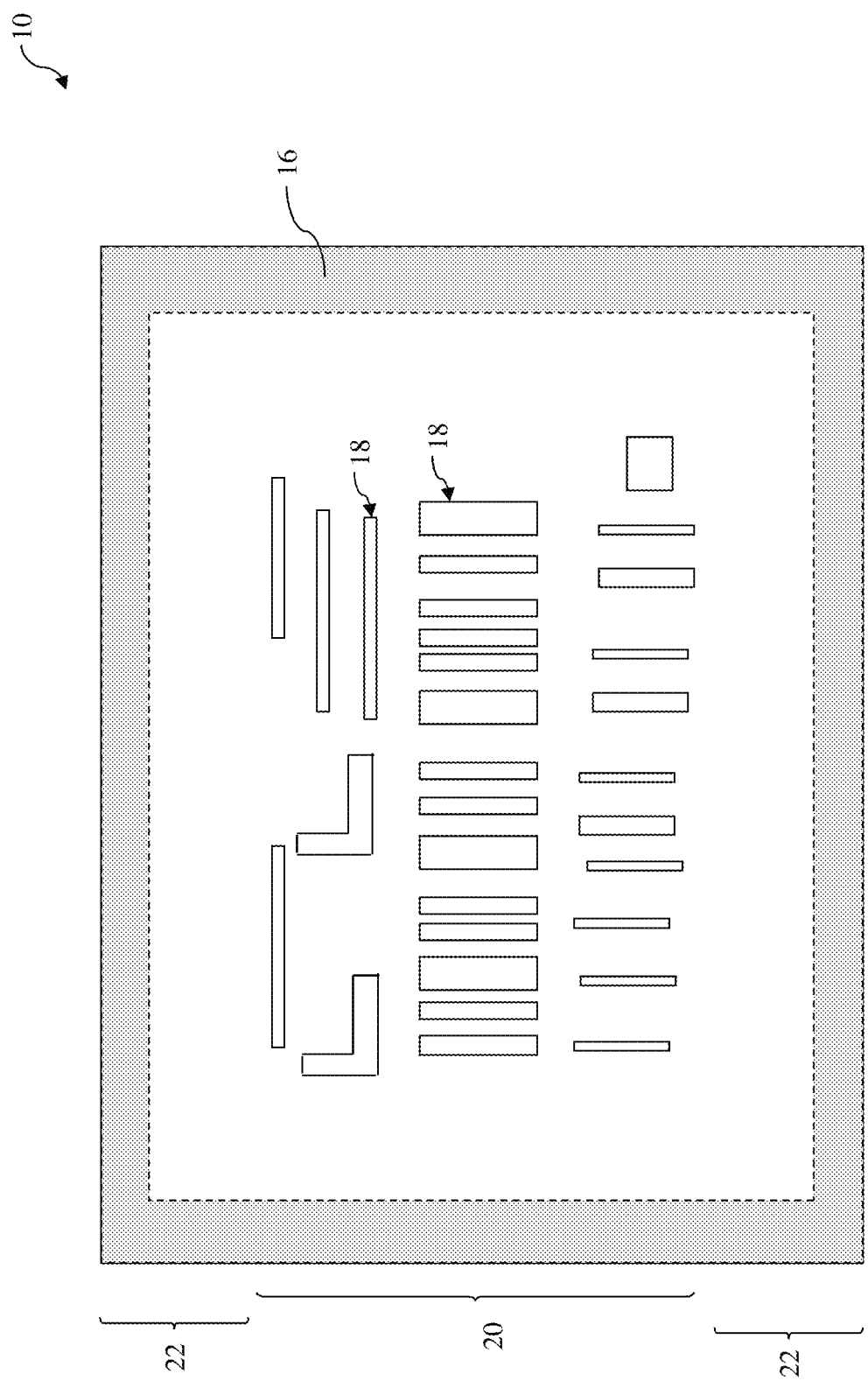
FIG. 3B is a top view of the photomask of FIG. 3A constructed in accordance with some embodiments.

FIGS. 3A and 3B are, respectively, sectional view and top view of the photomask 10 constructed according to some embodiments. The recess structure 16 includes a recess feature extended to the edges of the photomask 10 such that the conductive material layer 14 has a step profile at the edges of the photomask 10. In other words, the edge distance D is zero.

Figure 4:
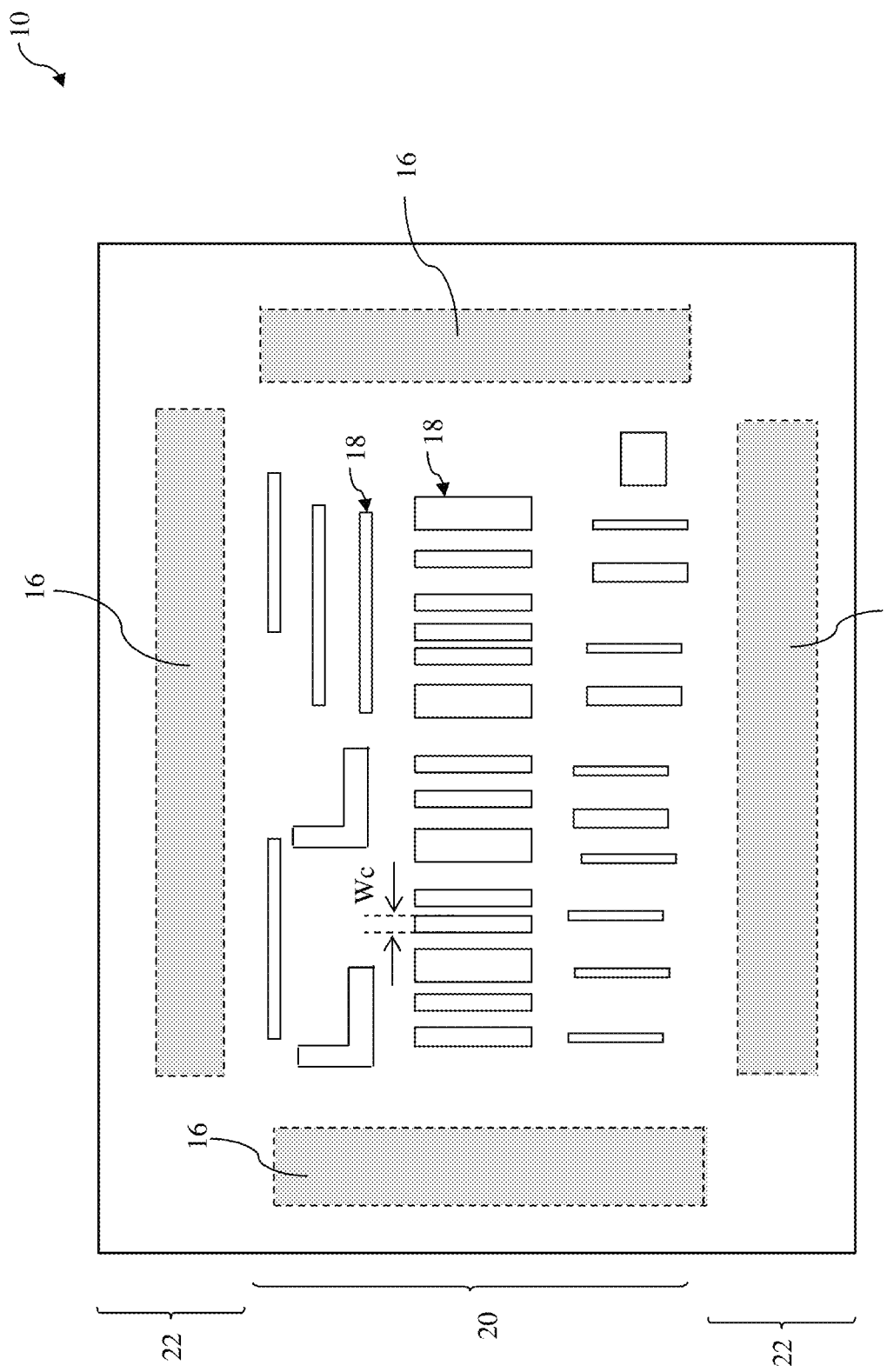
FIGS. 4 and 5 are top views of a photomask constructed in accordance with some embodiments.

In some embodiments as illustrated in FIG. 4 as a top view of the photomask 10, the recess structure 16 is a discontinuous structure and includes multiple recess segments configured with a gap between adjacent segments.

Figure 5:
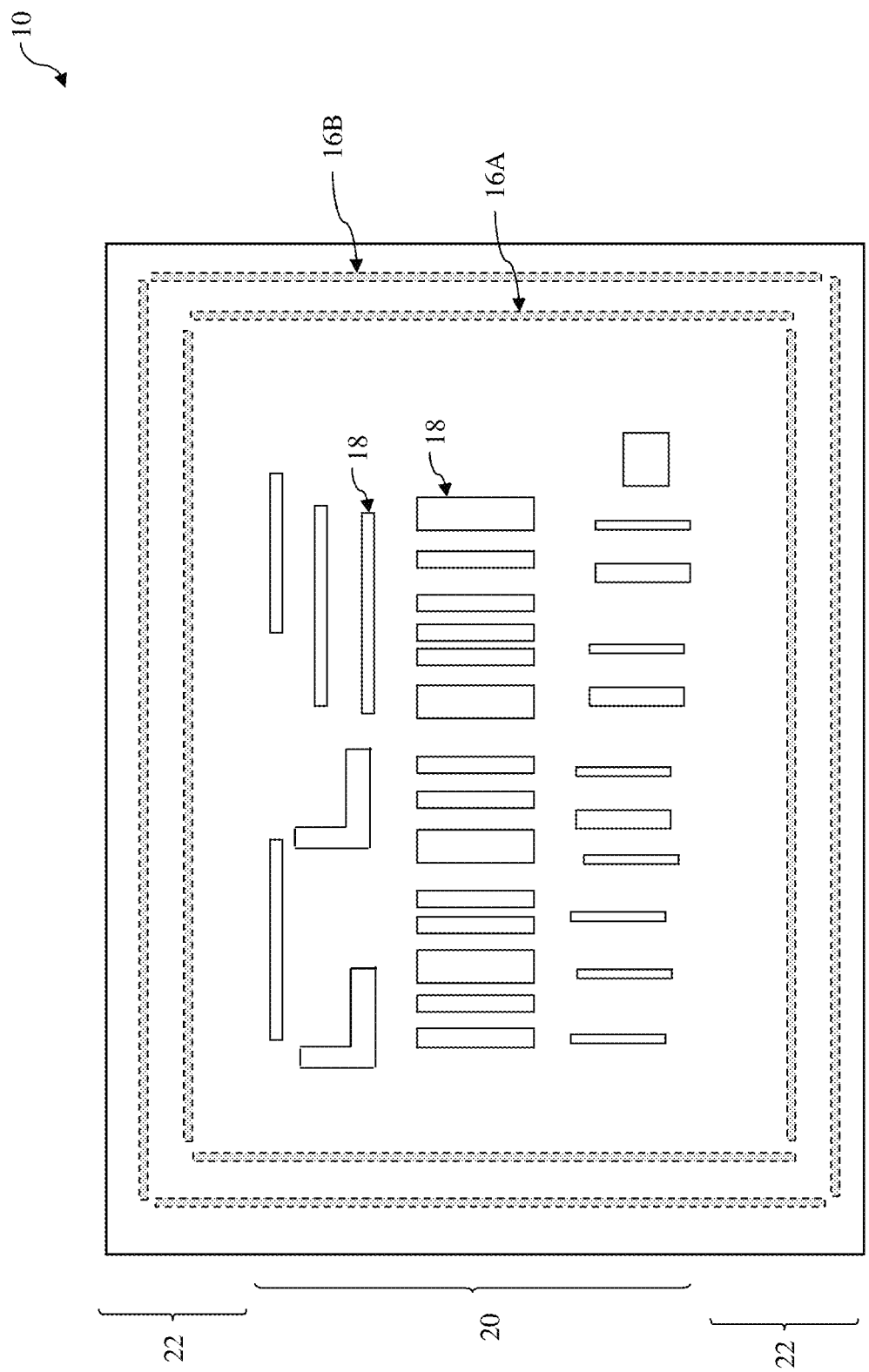

In some embodiments as illustrated in FIG. 5 as a top view of the photomask 10, the recess structure 16 includes a plurality of recess rings, such as a first recess ring 16A and a second recess ring 16B in the present example. Each recess ring may be a continuous ring (such as one illustrated in FIG. 2) or discontinuous (such as one illustrated in FIG. 4).

The recess structure 16 may have other configurations, such as various combinations of the recess structures illustrated in FIGS. 1 through 5. In some embodiments, the recess structure 16 has a discontinuous structure with multiple recess segments (similar to those in FIG. 4) but those recess segments are extended to the edges of the photomask 10 with zero edge distance (similar to the recess structure 16 in FIG. 3A).

Figure 6:
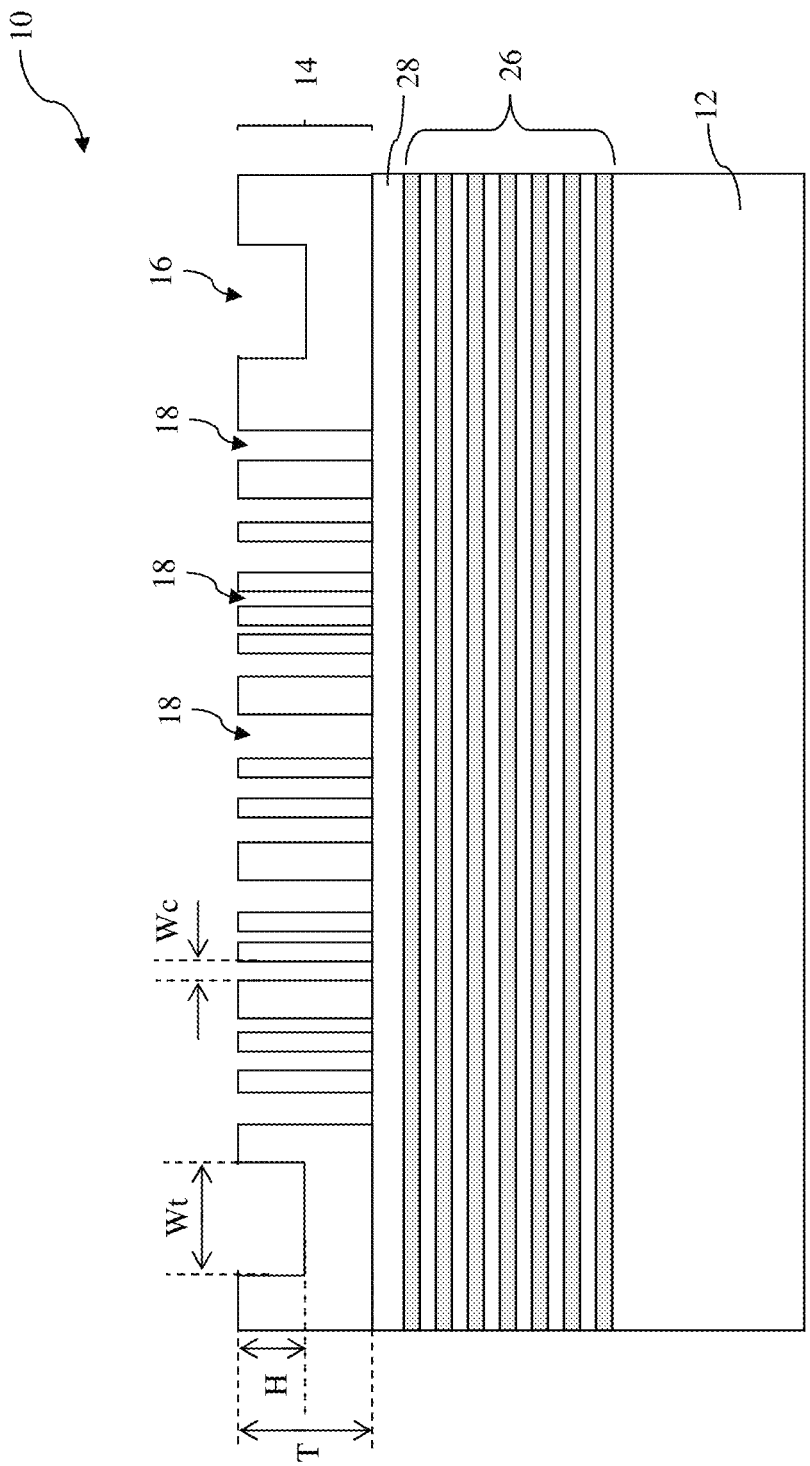
FIGS. 6 through 11 are sectional views of a photomask constructed in accordance with some embodiments.

The structure of the photomask 10 and the method making the same are further described according to other embodiments/alternatives. FIG. 6 is a sectional view of a reflective photomask 10 used in a EUV lithography exposure system and constructed in accordance with some embodiments.

The reflective photomask 10 includes a substrate 12. The substrate 12 is chosen to minimize image distortion due to mask heating by the intensified illumination radiation. In the present embodiments, the substrate 12 includes a LTEM. The LTEM may include fused quartz, silicon carbide, silicon oxide-titanium oxide alloy and/or other suitable LTEM known in the art. Alternatively, the substrate 12 includes other materials, such as quartz or glass, depending on design requirements of the photomask. The substrate 12 includes materials with a low defect level and a smooth surface.

The reflective photomask 10 includes a reflective multilayer (RML) 26 (also referred to as a multilayer mirror (MLM)) deposited over the substrate 12. The RML 26 is designed to reflect of the radiation light directed to the substrate 12. In one embodiment, the RML 26 includes alternating layers of two materials deposited on the top of the substrate 12 to act as a Bragg reflector that maximizes the reflection of the radiation light, such as EUV with 13.5 nm wavelength.

The combination of the two materials in the alternating layers is selected to provide a large difference in refractive indices between the two layers (for example, to achieve large reflectivity at an interface of the two layers according to Fresnel equations), yet provide small extinction coefficients for the layers (for example, to minimize absorption). In an example, the RML 26 includes molybdenum-silicon (Mo/Si) layer pairs. In another example, the RML 26 includes molybdenum-beryllium (Mo/Be) layer pairs. Film thicknesses in each layer pair of the RML 26 are adjusted depending on a wavelength and an angle of incidence of light (such as EUV radiation) incident on the photomask, such that the photomask achieves maximum constructive interference of light reflected from different interfaces of the RML 26. In general, reflectivity of the RML 26 increases as a number of layer pairs of the RML increases. In some embodiments, the number of layer pairs of the RML 26 is from twenty to eighty. For example, to achieve more than 90% of the maximum achievable reflectivity (with the chosen materials) of the RML 26 and minimize mask blank manufacturing time and costs, the RML 26 includes about forty layer pairs, such as forty Mo/Si pairs. In furtherance of the example, the Mo/Si pairs includes a silicon layer having a thickness of about 3 nm to 5 nm (about 4 nm); and a molybdenum layer having a thickness of about 2 nm to 4 nm (about 3 nm). Alternatively, the RML 26 includes any other number of layer pairs, depending on reflectivity specifications for the photomask. In other alternatives, the RML 26 may include a stack of more than two material layers, such as a stack of three or more material layers having different refractive indices and other characteristics to maximize reflectivity.

In a particular, the RML 26 includes molybdenum-silicon (Mo/Si) film pairs. The RML 26 includes about 40 (Mo/Si) film pairs and each Mo/Si film pair has a collective thickness of about 7 nm.

The photomask 10 further includes a capping layer 28 deposited over the RML 26. Because the capping layer 28 has different etching characteristics from the absorption layer, the capping layer 28 provides a protection to the RML 26, such as functioning as an etch stop layer in a patterning or a repairing process of the absorption layer. In one example, the capping layer 28 includes ruthenium (Ru). In furtherance of the example, the capping layer 28 has a thickness ranging from about 1 nm to about 5 nm.

The photomask 10 includes a conductive material layer 14 formed over the capping layer 28. The conductive material layer 14 functions as an absorption layer and is patterned to define an IC pattern 18 thereon. The absorption layer is designed to absorb radiation light (such as EUV light) during a lithography exposure process utilizing the photomask 10. The radiation light passes through the openings of the absorption layer and is reflected by the RML 26, thus the IC pattern is imaged to an IC substrate, such as a silicon wafer. In some embodiments, the absorption layer 14 includes tantalum boron nitride (TaBN) or tantalum boron oxynitride (TaBON). In some embodiments, the absorption layer 14 includes TaBN, TaBON, chromium (Cr), chromium oxide (CrO), titanium nitride (TiN), tantalum nitride (TaN), tantalum (Ta), titanium (Ti), or aluminum-copper (Al—Cu), palladium, aluminum oxide (AlO), molybdenum (Mo), and other suitable materials. In some embodiments, the absorption layer 14 includes multiple films.

In some embodiments, each of the material layers, such as the RML 26, the capping layer 28 or the conductive material layer 14, is deposited by a suitable deposition technique, such as chemical vapor deposition (CVD) or physical vapor deposition (PVD).

Furthermore, the absorption layer (or the conductive material layer 14) includes a recess structure 16 and an IC pattern 18. The IC pattern 18 includes include main features or additionally dummy features and/or assist features. The recess structure 16 is disposed at the frame region and is configured around the IC pattern. In some examples, the absorption layer has a thickness T ranging from about 30 nm to about 100 nm, and the recess height H of the recess structure 16 ranges from about 5 nm to about 95 nm.

The recess structure 16 is formed by a low resolution lithography patterning technology (such as low resolution photolithography patterning technology) and thereafter, the IC pattern 18 are formed in the circuit region using e-beam lithography technology. During the e-beam lithography process to form the IC pattern 18, the recess structure 16 redistributes the electrons in the absorption layer 14, reduces the second electron scattering effect and increases the resolution of the e-beam lithography.

In some embodiments, the formation of the recess structure 16 and the IC pattern 18 in the conductive material layer 14 includes deposition, a first patterning process to form the recess structure 16 and, thereafter, a second patterning process to from the IC pattern 18. The first patterning process further includes forming a patterned photoresist layer over the conductive material layer 14 using the low resolution photolithography and performing a first etch to form the recess structure 16 using the patterned photoresist layer as an etch mask. The patterned photoresist layer is removed after the first etch by wet stripping or plasma ashing. The second patterning process further includes forming a patterned electron-sensitive resist (electron-resist) layer over the conductive material layer 14 using an e-beam lithography patterning and performing a second etch to form the IC pattern 18 using the patterned electron-resist layer as an etch mask. During the second patterning process, the presence of the recess structure 16 reduces the second electron scattering of the e-beam lithography operation and accordingly, and the imaging resolution of the e-beam lithography patterning is enhanced.

Figure 7:
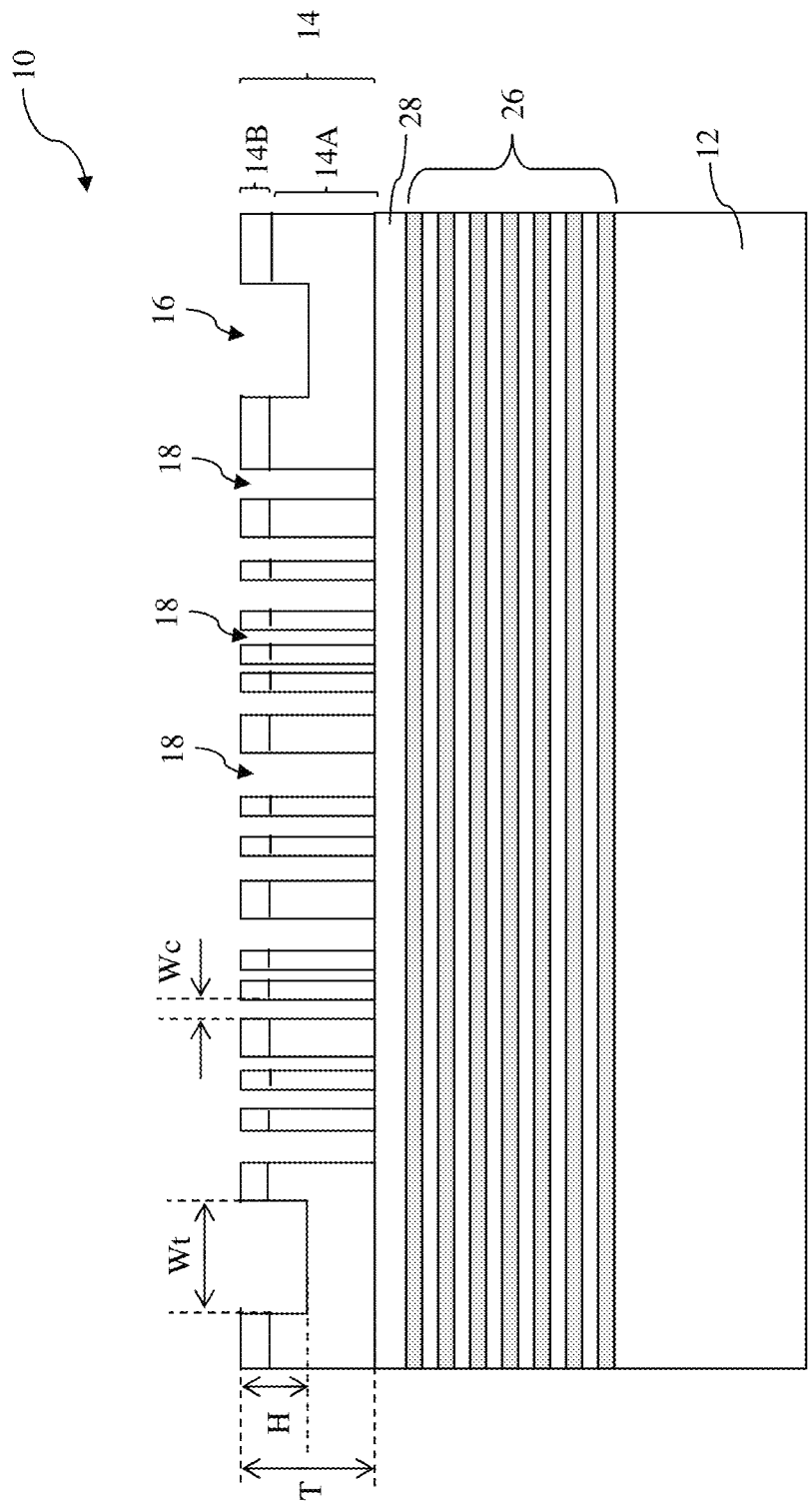

FIG. 7 is a sectional view of a photomask 10 constructed according to some embodiments. The photomask 10 in FIG. 7 is similar to the photomask 10 in FIG. 6. However, in FIG. 7, the conductive material layer 14 includes two films: an absorption film 14 and a protection film 14B over the absorption film 14A. The recess structure 16 is formed in the protection film 14B and extends to the absorption film 14A. The openings 18 extend through both the protection film 14B and the absorption film 14A. The absorption film 14A is similar to the absorption layer in FIG. 6 in term of composition. The protection film 14B is also a conductive material but may have conductivity less than that of the absorption film. In some embodiments, the protection film 14B has a thickness ranging from about 3 nm to about 80 nm. In some embodiments, the protection film 14B includes a suitable material, such as silicon oxide ($SiO_2$), silicon oxynitride ($Si_xO_yN_z$), molybdenum silicon ($Mo_xSi_y$), chromium nitride ($Cr_xN_y$), chromium oxide ($Cr_xO_y$), chromium oxynitride ($Cr_xO_yN_z$), or a combination thereof. Each of the parameters x, y and z has a range from 0 to 1. In those examples, silicon oxide (or silicon oxynitride) may have conductivity substantially less than that of the absorption film 14A. The protection film 14B is deposited by a suitable technique, such as CVD or PVD. The protection film 14B may function as a hard mask during the first and/or second patterning processes applied to the conductive material layer 14.

In some embodiments, the formation of the recess structure 16 and the IC pattern 18 in the conductive material layer 14 includes deposition, a first patterning process to form the recess structure 16 and, thereafter, a second patterning process to from the IC pattern 18. The deposition includes depositing the absorption film 14A and the protection film 14B. The first patterning process further includes forming a patterned photoresist layer over the protection film 14B using a low resolution photolithography patterning process; performing a first etch to the protection film 14B using the patterned photoresist layer as an etch mask; and performing a second etch to the absorption film 14A to form the recess structure 16 using the patterned protection film 14B as an etch mask. The second patterning process further includes forming a patterned electron-resist layer over the protection film 14B using an e-beam lithography patterning process; performing a third etch to the protection film 14B to form the openings 18 in the protection film 14B using the patterned electron-resist film as an etch mask; and performing a fourth etch to the absorption film 14A to extend the openings 18 to the absorption film using the patterned protection film 14B as an etch mask. During the second patterning process, the presence of the recess structure 16 reduces the second electron scattering of the e-beam lithography operation and accordingly, the imaging resolution of the e-beam lithography patterning is enhanced.

Figure 8:
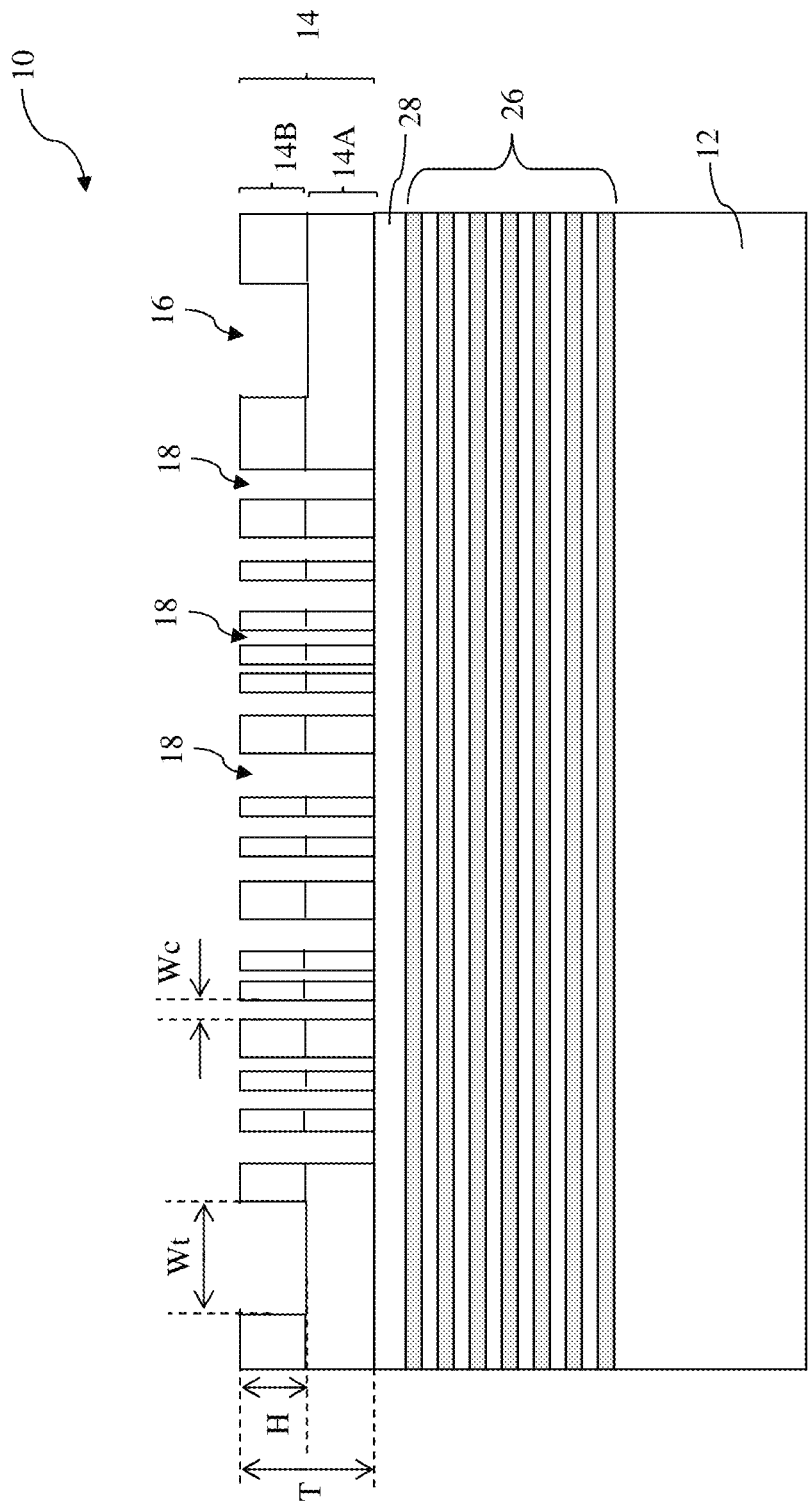

FIG. 8 is a sectional view of a photomask 10 constructed according to some embodiments. The photomask 10 in FIG. 8 is similar to the photomask 10 in FIG. 7. The conductive material layer 14 includes both the absorption film 14A and the protection film 14B. However, in FIG. 8, the recess structure 16 is formed only in the protection film 14B. The recess structure 16 includes through-trenches extending through the protection film 14B and stopping on the absorption film 14A such that the absorption film 14A is uncovered by the protection film 14B within the recess structure 16. The openings 18 in the circuit region are through-trenches extending through both the protection film 14B and the absorption film 14A. State differently, the recess structure 16 is formed in the protection film 14B and the trench depth of the recess structure 16 is equal to the thickness of the protection film 14B. The openings 18 are formed in both the protection film 14B and the absorption film 14A. The trench depth of the openings 18 is equal to the total thickness T of the conductive material layer 14 (or the total thickness of the protection film 14B and plus the thickness of the absorption film 14A).

In some embodiments, the formation of the recess structure 16 and the openings 18 in the conductive material layer 14 includes deposition, a first patterning process to form the recess structure 16 and, thereafter, a second patterning process to from the openings 18. The deposition includes depositing the absorption film 14A and the protection film 14B. The first patterning process further includes forming a patterned photoresist layer over the protection film 14B using the low resolution photolithography patterning process; and performing a first etch to the protection film 14B using the patterned photoresist layer as an etch mask. The second patterning process further includes forming a patterned electron-resist layer over the protection film 14B using an e-beam lithography operation; and performing a second etch to the protection film 14B and the absorption film 14A to form the openings 18, using the patterned electron-resist film as an etch mask. During the second patterning process, the presence of the recess structure 16 reduces the second electron scattering of the e-beam lithography operation and accordingly, the imaging resolution of the e-beam lithography operation is enhanced.

Figure 9:
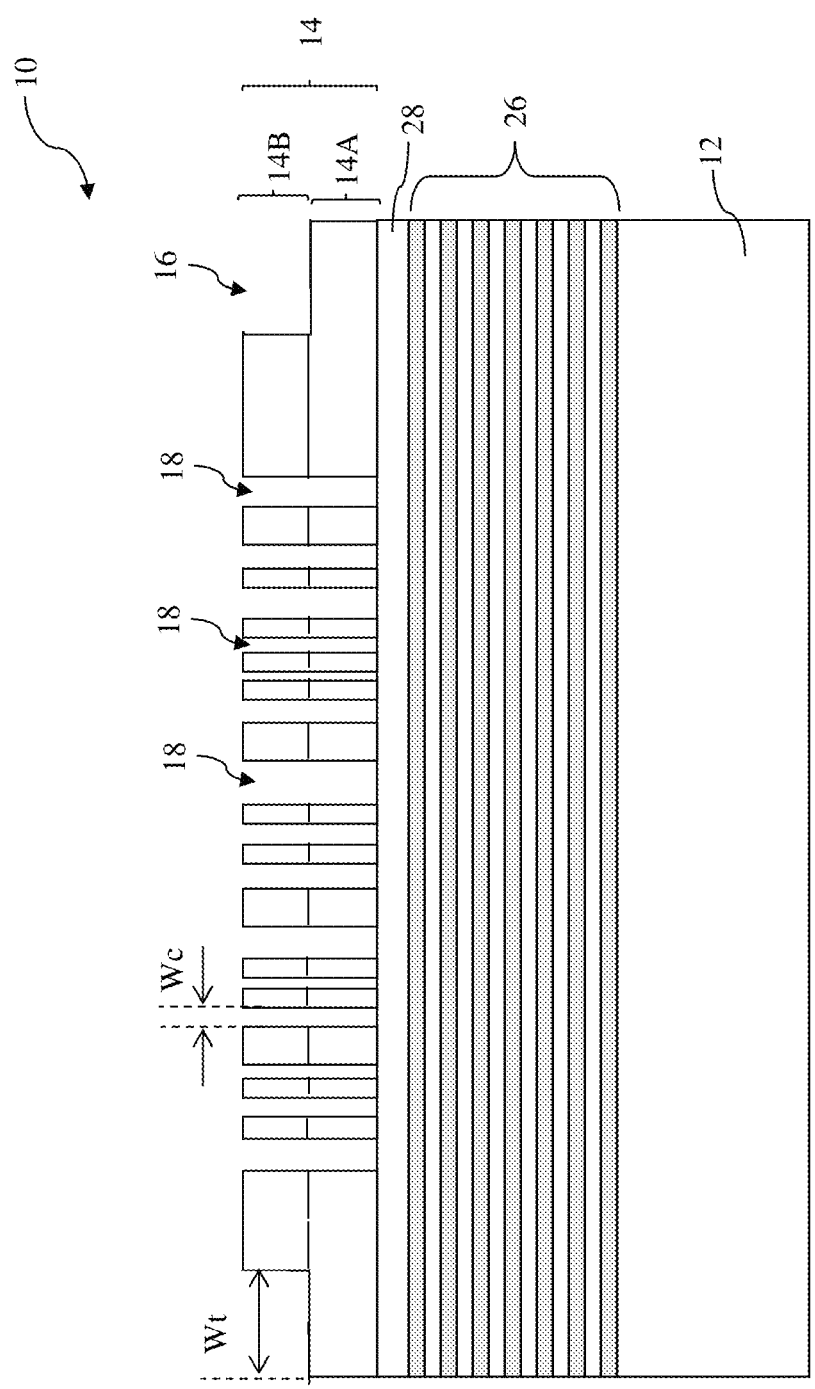

FIG. 9 is a sectional view of a photomask 10 constructed according to some embodiments. The photomask 10 in FIG. 9 is similar to the photomask 10 in FIG. 8. The conductive material layer 14 includes both the absorption film 14A and the protection film 14B. The recess structure 16 is only defined in the protection film 14B. The openings 18 are defined in the through-trenches of both the protection film 14B and the absorption film 14A. However, the recess structure 16 includes a recess feature horizontally extending to the edges of the photomask 10.

Figure 10:
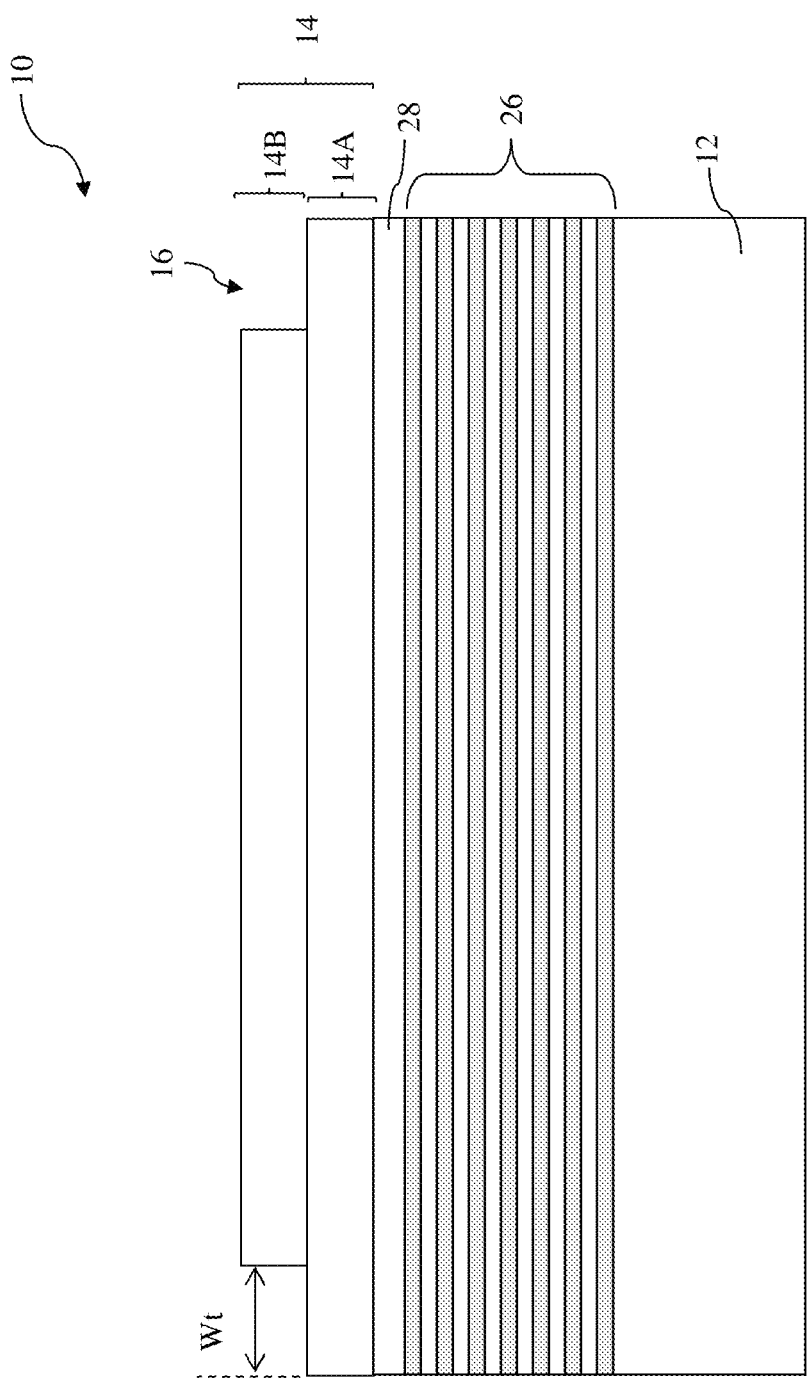

In some embodiments, the formation of the recess structure 16 and the IC pattern 18 in the conductive material layer 14 includes deposition, a first patterning process to form the recess structure 16 and, thereafter, a second patterning process to from the IC pattern 18. The first patterning process includes forming a patterned photoresist layer over the protection film 14B using a low resolution photolithography operation; and performing a first etch to the protection film 14B using the patterned photoresist layer as an etch mask. The first patterning process ends up with an intermediate structure of the photomask 10 illustrated in FIG. 10 as a sectional view. In FIG. 10, the protection film 14B is an island disposed over the absorption film 14A with the edge portions removed.

Figure 11:
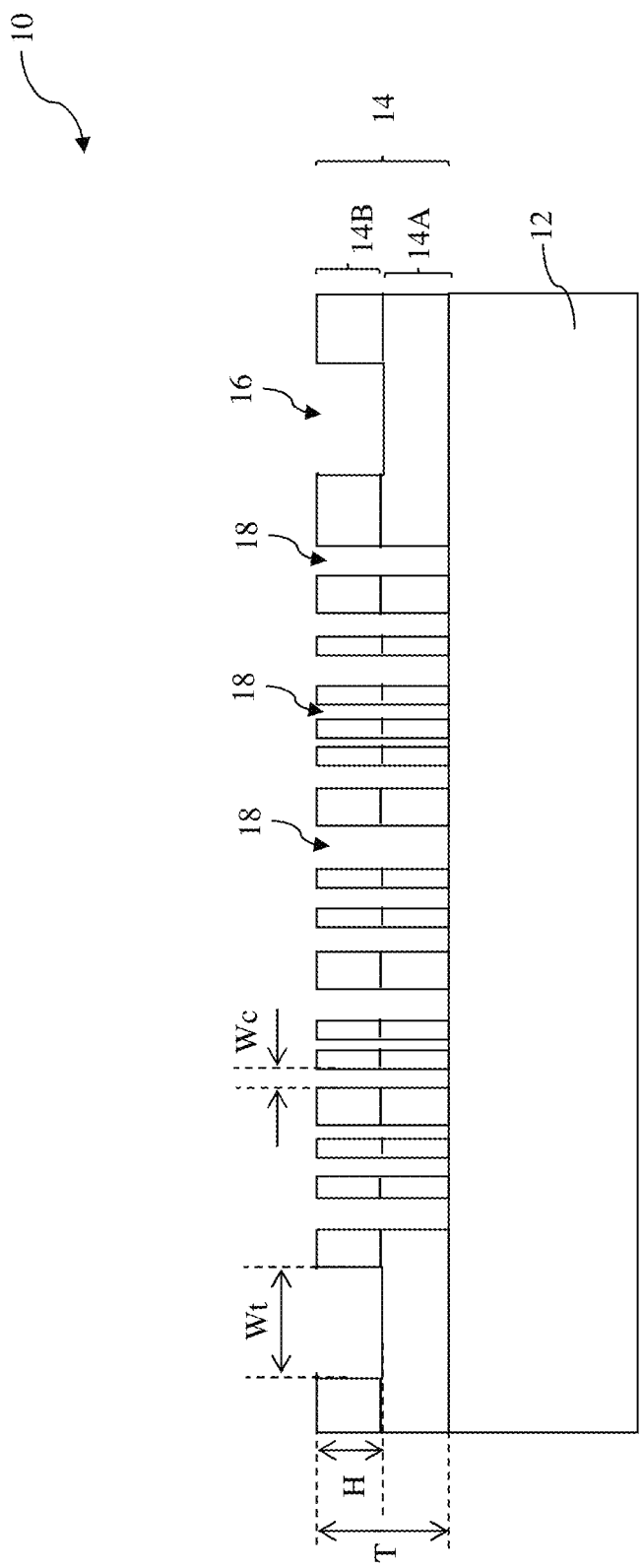

The photomask 10 is described in various embodiments and illustrated in FIGS. 6, 7, 8 and 9, respectively. Even though the photomask illustrated as a reflective photomask for EUV lithography, the photomask with similar structures may be configured as a transmissive photomask for UV or DUV lithography. In this consideration, the configuration of the recess structure 16 is similar to the corresponding reflective photomask. For example, a transmissive photomask may have a recess structure 16 similar to that of the photomask in FIG. 8. Such a transmissive photomask 10 is further illustrated in FIG. 11 in a sectional view. The photomask 10 in FIG. 11 includes a conductive material layer 14, which further includes an absorption film 14A and a protection film 14B. The recess structure 16 is formed only in the protection film 14B. The openings 18 are formed in both the protection film 14B and the absorption film 14A. However, the photomask 10 in FIG. 11 is a transmissive photomask and includes a transparent substrate 12. The absorption layer 14A may include chromium and the conductive material layer 14 may be directly disposed on the substrate 12.

Figure 12:
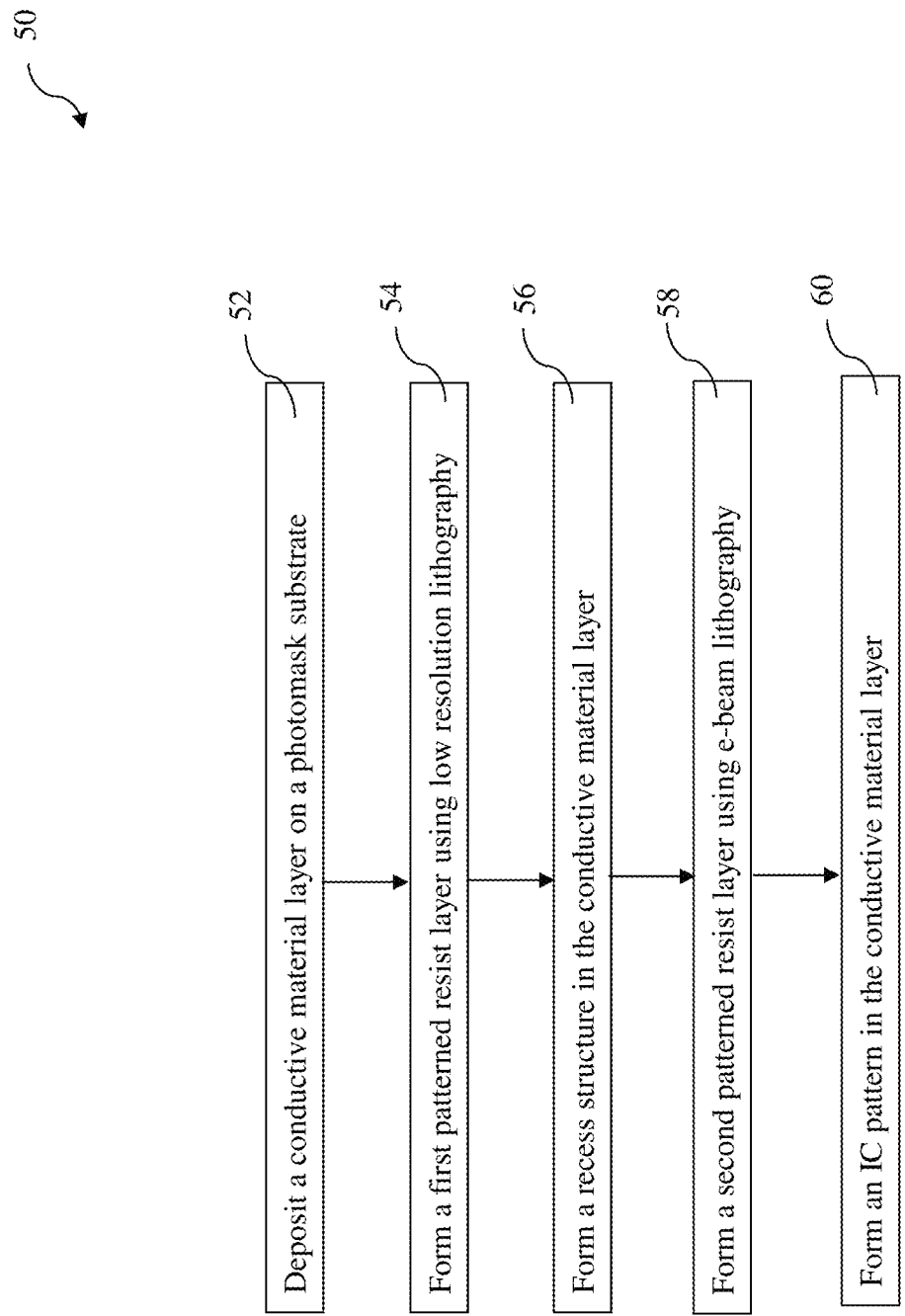
FIG. 12 is a flowchart of a method for fabricating a photomask constructed in accordance with some embodiments.
Figure 13:
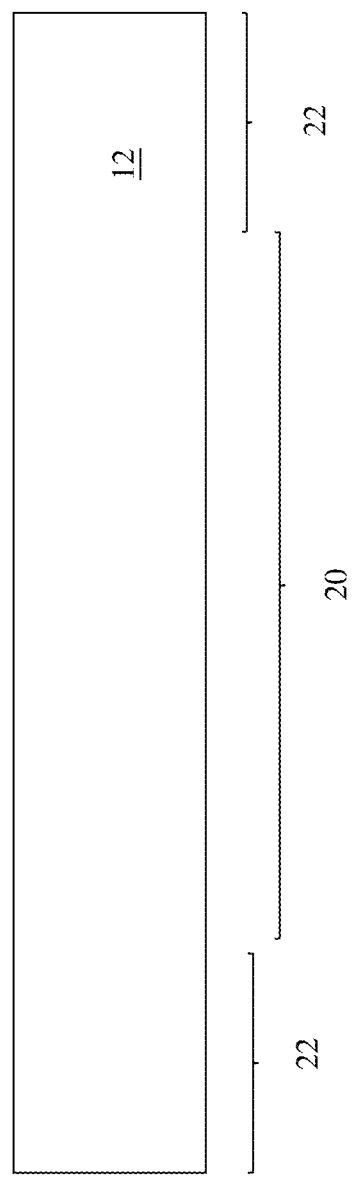
FIGS. 13 through 18 are sectional views of a photomask at various fabrication stages constructed in accordance with some embodiments.

FIG. 12 is a flowchart of a method 50 for fabricating a photomask 10, constructed according to various embodiments. FIGS. 13 through 18 are sectional views of the photomask 10 fabricated by the method 50 constructed according to some embodiments. The method 50 begins with a substrate 12 as illustrated in FIG. 13. In some embodiments for a reflective photomask, the substrate 12 includes LTEM. In some embodiments for a transmissive photomask, the substrate 12 includes a transparent material, such as fused quartz.

Figure 14:
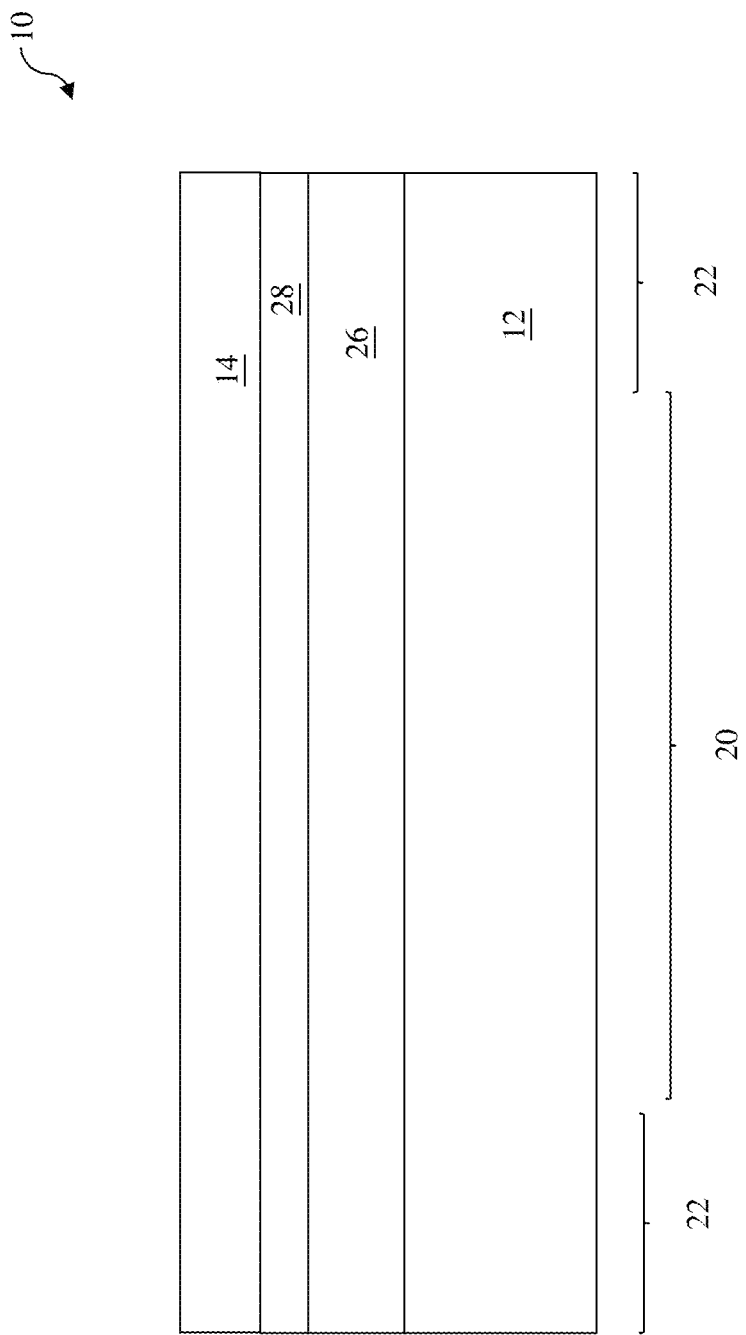

The method 50 includes an operation 52 by forming various material layers on the substrate 12, as illustrated in FIG. 14. In some embodiments for the reflective photomask, a RML 26 is formed over the substrate 12 and a capping layer 28 is formed over the RML 26. The conductive material layer 14 is formed over the capping layer 28. The deposition may utilize a suitable technique, such as CVD and PVD. The conductive material layer 14 may include TaBN or TaOBN. In some embodiments for the transmissive photomask, the conductive material layer 14 is formed over the substrate 12. The conductive material layer 14 may include chromium. In some embodiments, the conductive material layer 14 includes two films, such as an absorption film 14A and a protection film 14B, as illustrated in FIG. 7 or FIG. 8.

Figure 15:
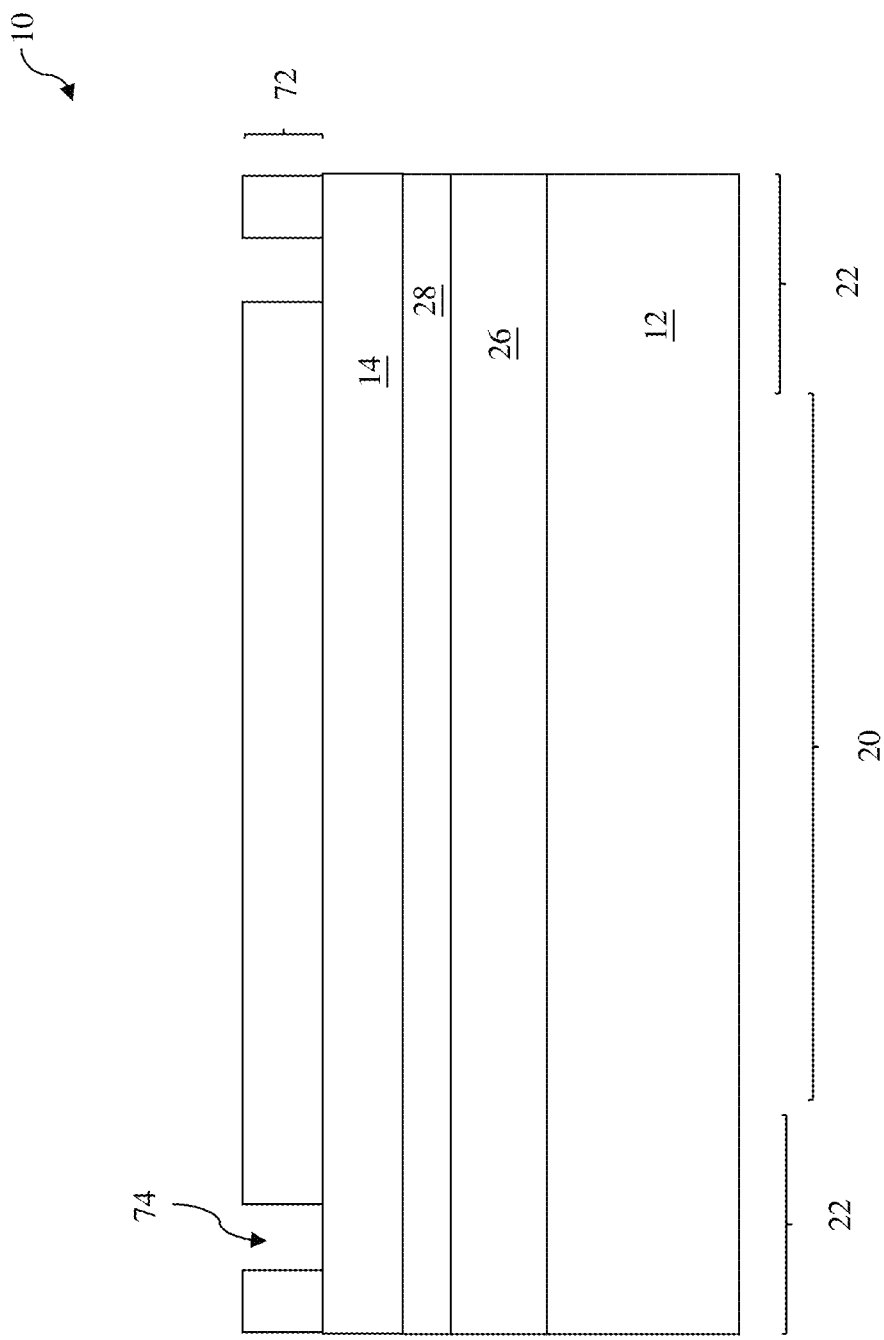

Referring to FIG. 15, the method 50 proceeds to an operation 54 by forming a first patterned resist layer 72 on the conductive material layer 14 using a low resolution lithography technology, such as an UV lithography process. The first patterned resist layer 72 includes one or more opening 74 that define the recessing regions of the recess structure 16 to be formed in the conductive material layer 14. Since the width of the opening 74 is substantially large (such as in a range from about 0.01 nm to about 14.99 mm according one example), the corresponding lithography process can utilize a relative low resolution technology. The lithography process includes resist coating, lithography exposure, and developing. The lithography process may further include other steps, such as soft baking, post-exposure-baking (PEB) and/or hard baking.

Figure 16:
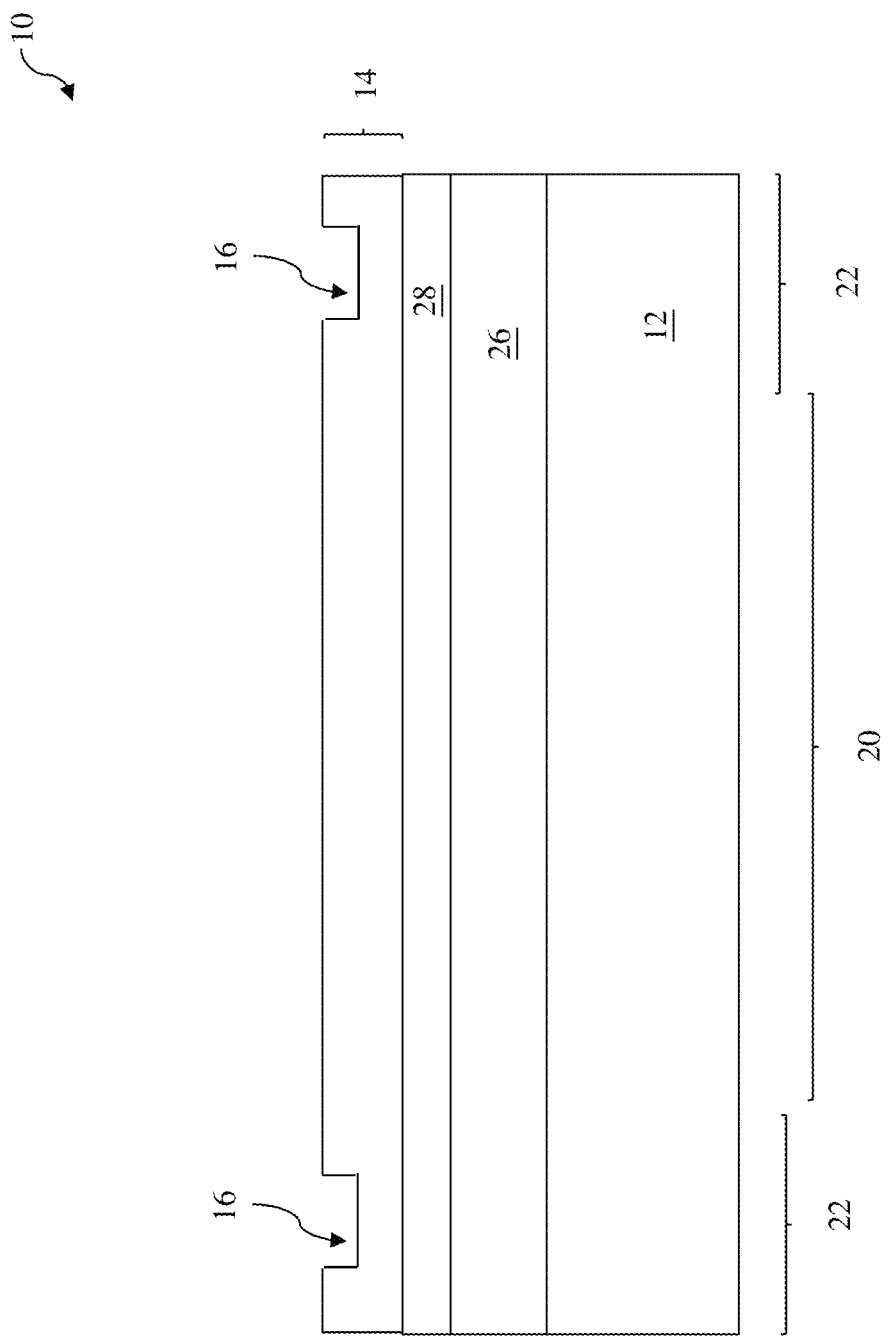

Referring to FIG. 16, the method 50 proceeds to an operation 56 by forming a recess structure 16 in the conductive material layer 14 using the first patterned resist layer 72 as an etch mask. The etch process is controlled to recess the conductive material layer within the openings 74 in a proper mode, such as by controlling the etching duration. In some embodiments, the conductive material layer 14 includes the protection film 14B, the etch process is designed to selectively etch the protection film 14B and stop on the absorption film 14A. Thereafter, the first resist layer 72 is removed by wet stripping or plasma ashing.

Figure 17:
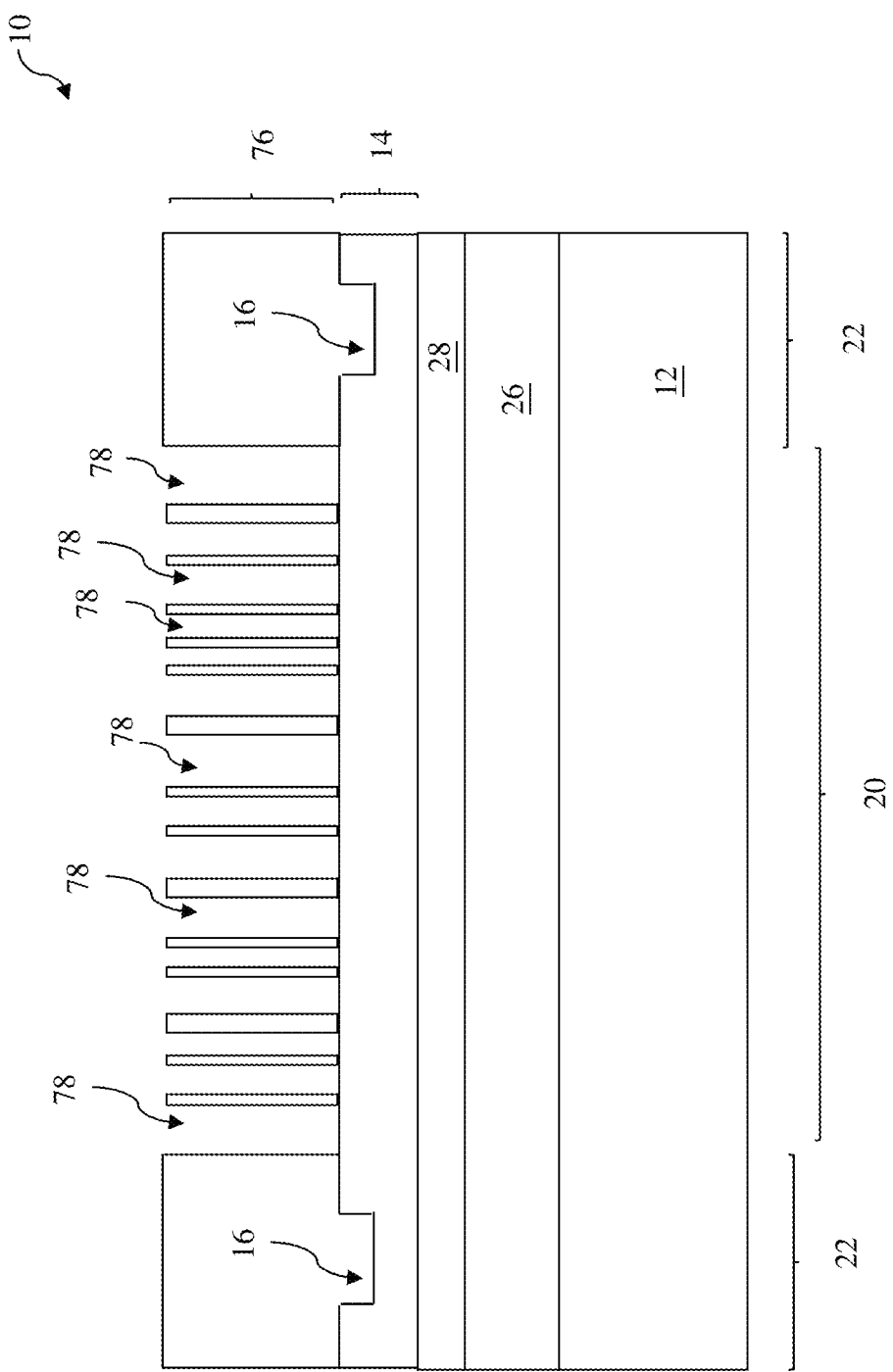

Referring to FIG. 17, the method 50 proceeds to an operation 58 by forming a second patterned resist layer 76 on the conductive material layer 14 using e-beam lithography, such as e-beam direct writing (EBDW) or other suitable e-beam patterning technology. The second patterned resist layer 76 includes a plurality of openings 78 that define the corresponding IC pattern 18 to be formed in the conductive material layer 14. Similarly, the e-beam lithography process includes resist coating, e-beam exposure, and developing. The e-beam lithography process may further include other steps, such as one or more baking steps. During the e-beam exposure process, the recess structure 16 of the conductive material layer 14 will redistribute the scattered electrons to lower portion of the conductive material layer 14 with less chance of being back to the second resist layer 76, reducing the possibility of the second electrons entering the second resist layer 76. Therefore, the resolution of the corresponding e-beam patterning is enhanced.

In some embodiments, during the e-beam exposure process, the conductive material layer 14 is electrically grounded in order to further reduce the effect of second electron scattering, thereby further enhancing the resolution. The grounding may be implemented through a proper configuration. For example, the e-beam lithography system to perform the e-beam lithography process may be modified with a proper grounding mechanism. In furtherance of the example, a substrate stage of the e-beam lithography system is modified to secure the photomask and further provide an electrical path to ground the conductive material layer 14.

Figure 18:
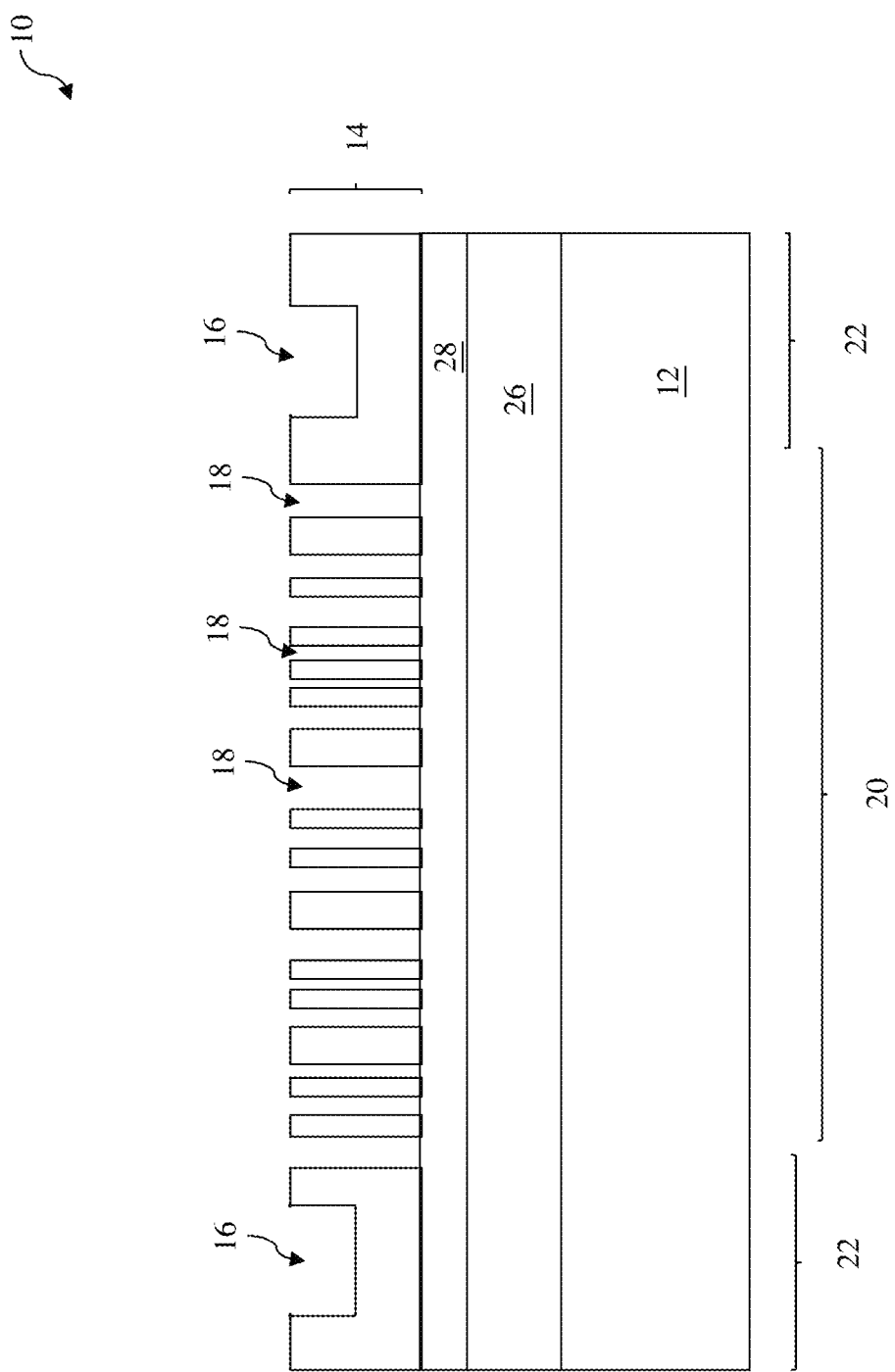

Referring to FIG. 18, the method 50 proceeds to an operation 60 by forming an IC pattern 18 in the conductive material layer 14 using the second patterned resist layer 76 as an etch mask. At operation 60, an etch process is designed to selectively etch the conductive material layer 14. In some embodiments, the conductive material layer 14 includes the protection film 14B, the etch process may include two etch steps designed to selectively etch the protection film 14B and the absorption film 14A, respectively. Thereafter, the second resist layer 76 is removed by wet stripping or plasma ashing.

Figure 19:
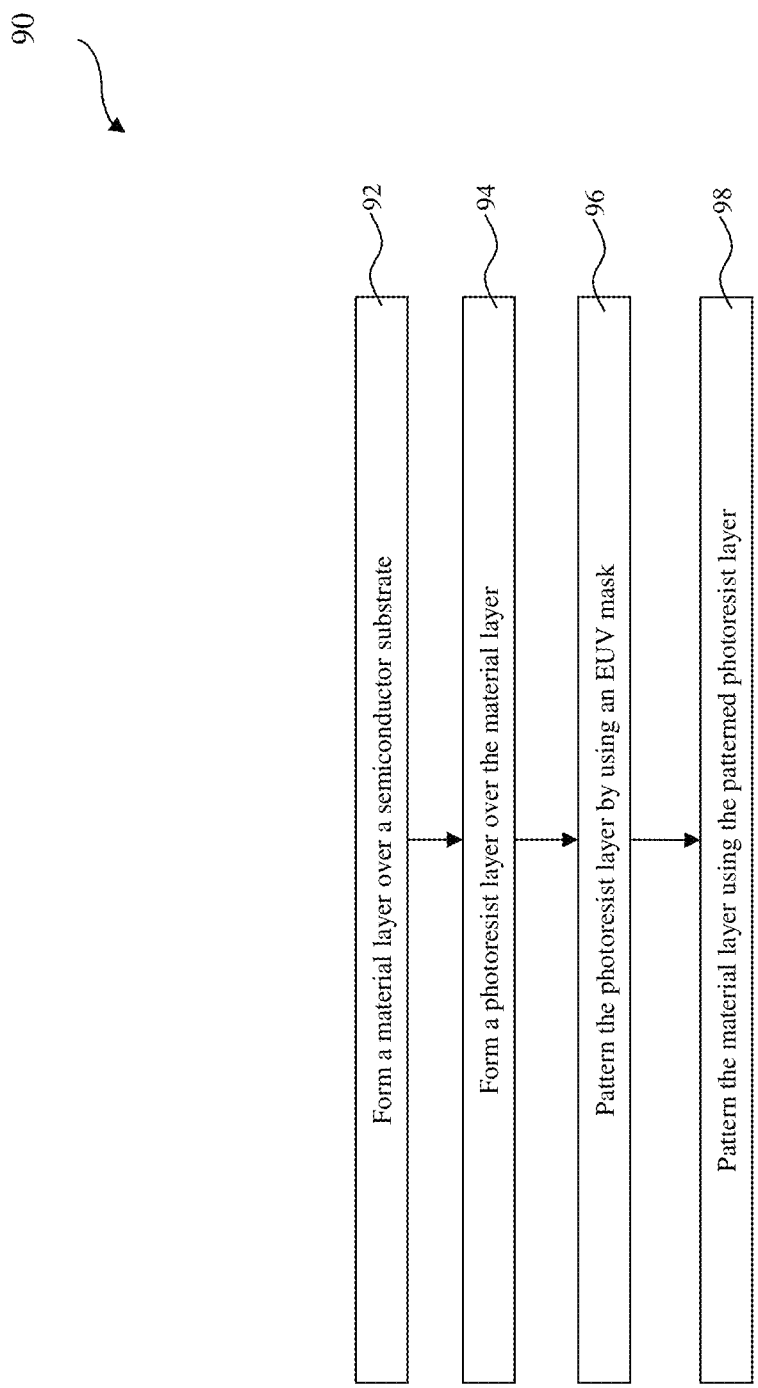
FIG. 19 is a flowchart of a method for fabricating an integrated circuit on a semiconductor substrate in accordance with some embodiments.

FIG. 19 is a flowchart of a method 90 making an integrated circuit utilizing the photomask 10 according to some embodiments. The method 90 starts with a semiconductor substrate or other suitable substrate to be patterned to form an integrated circuit thereon. In the present embodiment, the semiconductor substrate includes silicon. Alternatively or additionally, the semiconductor substrate includes germanium, silicon germanium or other suitable semiconductor material, such as diamond, silicon carbide or gallium arsenic. The semiconductor substrate may further include additional features and/or material layers, such as various isolation features formed in the substrate. The semiconductor substrate may include various p-type doped regions and/or n-type doped regions configured and coupled to form various devices and functional features. All doping features may be achieved using a suitable process, such as ion implantation in various steps and techniques. The semiconductor substrate may include other features, such as shallow trench isolation (STI) features. The semiconductor substrate may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

The method 90 may include an operation 92 to form a material layer over the semiconductor substrate (or other suitable substrate). As one embodiment for illustration, the material layer includes a dielectric material, such as an interlayer dielectric (ILD) to form conductive features (e.g., metal lines, vias or contacts) therein. The ILD layer may include silicon oxide, low dielectric material (with a dielectric constant less than that of the thermal silicon oxide). The ILD layer may include more than one or more dielectric films. The ILD layer may be deposited on the semiconductor substrate by chemical vapor deposition (CVD), spin-on coating or other suitable technique. The material layer may alternatively include other material to be patterned. For example, the material layer may include a conductive material, such as doped polysilicon, metal or metal alloy, to be patterned to form gate electrodes for field effect transistors in an integrated circuit.

The method 90 proceeds to an operation 94 by forming a photoresist layer over the material layer. The photoresist layer is sensitive to the radiation from the exposing source during a subsequent photolithography exposing process. In the present embodiment, the photoresist layer is sensitive to EUV light used in the photolithography exposure process. The photoresist layer may be formed over the material layer by spin-on coating or other suitable technique. The coated photoresist layer may be further baked to drive out solvent in the photoresist layer.

The method 90 proceeds to an operation 96 by patterning the photoresist layer in an EUV lithography process using an EUV photomask, such as the EUV photomask 10 described in FIG. 6. The EUV photomask 10 includes a capping layer 28 formed over the RML layer 26. The EUV mask includes a conductive material layer patterned to have the recess structure 16 and the IC pattern 18.

The patterning of the photoresist layer includes performing a EUV lithography exposure process in a EUV exposure system using the EUV photomask 10. During the EUV exposure process, the IC pattern 18 defined on the EUV mask is imaged to the photoresist layer to form a latent patent thereon. The patterning of the photoresist layer further includes developing the exposed photoresist layer to form a patterned photoresist layer a plurality of openings. In one embodiment where the photoresist layer is a positive tone photoresist layer, the exposed portions of the photoresist layer are removed during the developing process. The patterning of the photoresist layer may further include other process steps, such as one or more baking steps at different stages. For example, a PEB process may be implemented between the photolithography exposure process and the developing process.

The method 90 proceeds to an operation 98 by patterning the material layer utilizing the patterned photoresist layer. In one embodiment, the patterning the material layer includes applying an etching process to the material layer using the patterned photoresist layer as an etch mask. The portions of the material layer exposed within the openings of the patterned photoresist layer are etched while the rest portions are protected from etching. In the present embodiment, the operation 98 forms various trenches in the ILD layer.

The method 90 may include other processing steps. For example, the patterned photoresist layer may be removed by wet stripping or plasma ashing after the operation 98. In another example, one or more conductive materials are filled (such as by deposition and polishing) in the trenches of the ILD layer to form corresponding conductive features (such as contacts, vias, metal lines or a combination thereof) for electrical routing.

In alternative embodiment, the method 90 may include the operations 94, 96 and 98 to form doped features in the semiconductor substrate. In this case, the patterned photoresist layer formed by the operations 94 and 96 is used as an ion implantation mask and the operation 98 includes performing an ion implantation process to the semiconductor substrate. The ion implantation process introduces dopant species to the semiconductor substrate through the openings of the patterned photoresist layer.

Figure 20:
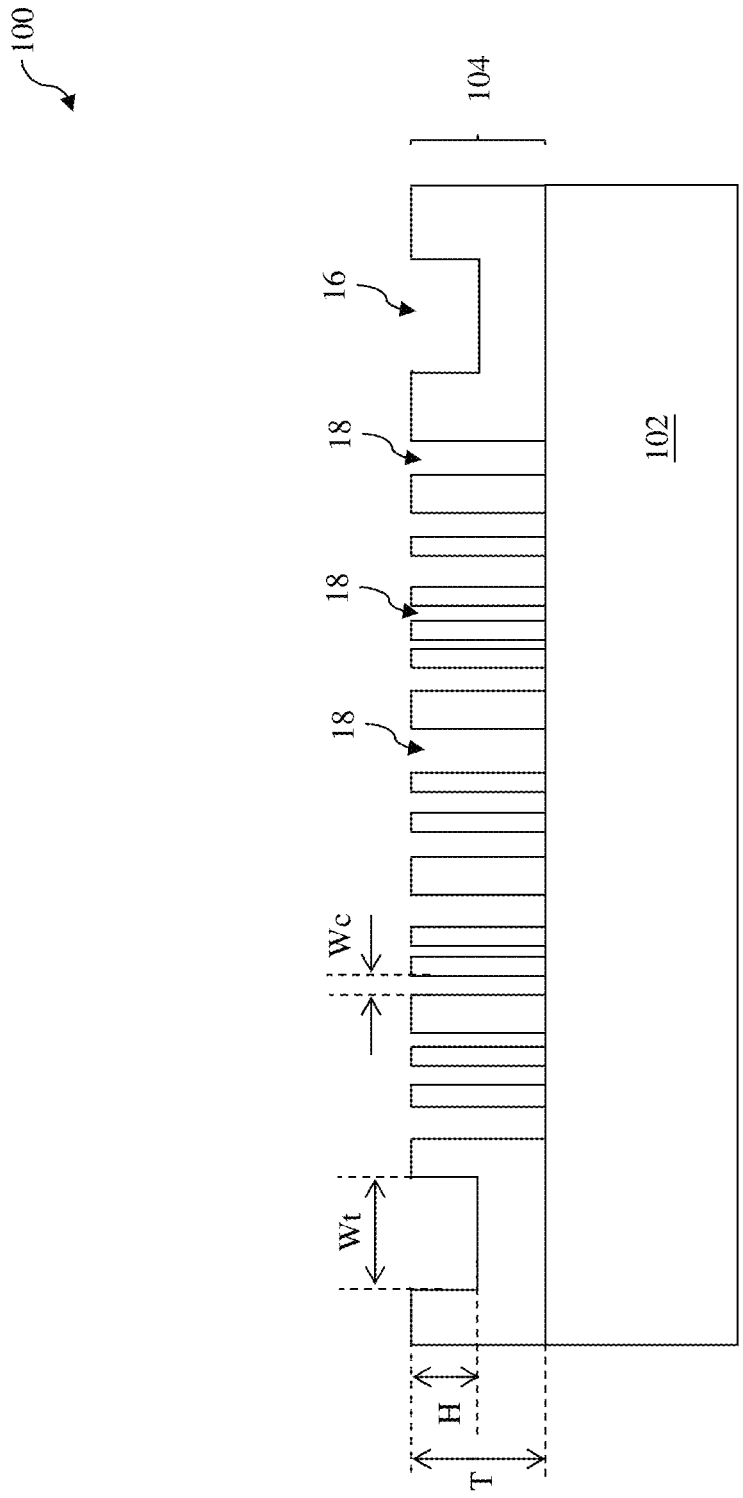
FIG. 20 is a sectional view of a semiconductor substrate constructed in accordance with some embodiments.

In some embodiments where a semiconductor wafer is directly patterned using an e-beam lithography process, the method 50 may be used to fabricate the semiconductor wafer with the reduced effect of the second electron scattering during the e-beam lithography process. In this case, the photomask substrate at the operation 52 is replaced by an IC substrate, such as a semiconductor wafer 100 illustrated in FIG. 20 in a sectional view constructed according to some embodiments. In some examples, the semiconductor wafer 102 includes silicon. Alternatively or additionally, the semiconductor wafer 102 includes germanium, silicon germanium or other suitable semiconductor material, such as diamond, silicon carbide or gallium arsenic. The semiconductor wafer 102 may further include additional features and/or material layers, such as various isolation features formed in the substrate. The semiconductor substrate may include various p-type doped regions and/or n-type doped regions configured and coupled to form various devices and functional features. All doping features may be achieved using a suitable process, such as ion implantation in various steps and techniques. The semiconductor substrate may include other features, such as shallow trench isolation (STI) features.

At operation 52, a conductive material layer 104 is deposited on the semiconductor wafer 102. In some embodiments, the conductive material layer 104 includes a conductive material for gate electrode, such as doped polysilicon, metal, metal alloy, silicide or other suitable conductive material.

At operation 54, a first patterned resist layer is formed over the conductive material layer 104 using a low resolution lithography process. At operation 56, the recess structure 16 is formed in the conductive material layer 104 by an etch process. Thereafter, the first patterned resist layer is removed.

At operation 58, a second patterned resist layer is formed over the conductive material layer 104 to define an IC pattern therein, using the e-beam lithography process. The effect of second electron scattering is reduced by the recess structure 16. During e-beam lithography exposure process, the conductive material layer 104 may be electrically grounded to further reduce the effect of second electron scattering.

At operation 60, the conductive material layer 104 is etched through the openings of the second patterned resist layer, thereby forming gate electrodes for IC devices, such as field-effect transistors (FETs). This example, even though a EUV photomask is used. However, in some other embodiments, a transimittive photomask (such as one in FIG. 11) process may be used with corresponding lithography to pattern the material layer.

Although various embodiments of the photomask, the method making the same and the method using the same are provided according to various aspects of the present disclosure, other alternatives and modifications may be used without departure of the spirit of the present disclosure.

In some other embodiment, the photomask 10 may be different type of photomask, such as binary intensity mask (BIM). The photomask 10 may incorporate other resolution enhancement features, such as phase shift mask (PSM) and/or optical proximity correction (OPC).

In the present disclosure, a photomask, the method making the same and the method using the same are provided in various embodiments. The photomask includes a recess structure formed in a conductive material layer and is configured in the edges surrounding the IC pattern. The IC pattern is formed in the conductive material layer using an e-beam lithography process. During the e-beam lithography process to form the IC pattern on the photomask, the recess structure redistributes the electrons in the conductive material layer, reduces the second electron scattering effect and increases the resolution of the e-beam lithography process. The disclosed structure of the photomask is advantageous to the EUV mask. First, the experiments shown that the second electron scattering is further increased since the multilayer reflection coating reflects the e-beam. Second, the conductive material layer in the EUV photomask is more conductive (such as compared with the conductive material layer of a transmissive photomask) and the reduction to the effect of second electron scattering is more apparent.

Thus, the present disclosure provides a photomask in accordance with some embodiments. The photomask includes a substrate; and a conductive material layer dispose over the substrate and patterned to include a plurality of openings and a recess structure surrounding the plurality of openings.

The present disclosure also provides a method for fabricating a photomask in accordance with some embodiments. The method includes providing a substrate; depositing a conductive material layer over the substrate; patterning the conductive material layer, thereby forming a recess structure in the conductive material layer; and thereafter, performing an electron-beam (e-beam) lithography patterning process to the conductive material layer, thereby forming a plurality of openings according to an integrated circuit (IC) design layout.

The present disclosure also provides a method for forming an integrated circuit in accordance with some embodiments. The method includes forming a photoresist layer over a substrate; and patterning the photoresist layer using a photomask in a photolithography process. The photomask includes a substrate, and a conductive material layer dispose over the substrate and patterned to include a plurality of openings and a recess structure surrounding the plurality of openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask, comprising:
   a substrate; and a conductive material layer disposed over the substrate and patterned to include a plurality of openings and a recess structure surrounding the plurality of openings, wherein a portion of the conductive material layer is positioned directly under the recess structure such that the recess structure is separated from the substrate by the portion of the conductive layer.

2. The photomask of claim 1, wherein the plurality of openings defines an integrated circuit (IC) pattern.

3. The photomask of claim 2, wherein the recess structure includes a continuous recess that encircles the plurality of openings.

4. The photomask of claim 2, wherein the recess structure includes a plurality of recess segments configured surrounding the plurality of openings.

5. The photomask of claim 2, wherein the recess structure is extended to edges of the photomask.

6. The photomask of claim 1, wherein
the conductive material layer has a thickness T;
the recess structure has a recess depth D; and
a ratio D/T ranges between 1/10 and 9/10.

7. The photomask of claim 1, wherein the conductive material layer includes an absorption film and a hard mask disposed over the absorption film.

8. The photomask of claim 7, wherein
the recess structure is formed in the hard mask and vertically extends to the absorption film; and
the plurality of openings is formed in both the absorption film and the hard mask.

9. The photomask of claim 1, further comprising a reflective multilayer disposed between the substrate and the conductive material layer, wherein
the substrate includes a low thermal expansion material (LTEM);
the conductive material layer includes tantalum boron nitride (TaBN); and
the reflective multilayer includes a plurality of alternating molybdenum-silicon (Mo/Si) films.

10. The photomask of claim 9, further comprising a capping layer of ruthenium (Ru) disposed between the reflective multilayer and the conductive material layer.

11. The photomask of claim 1, wherein the recess structure is configured and designed so that to reduce second electron scattering effect during patterning the photomask by electron-beam.

12. The photomask of claim 1, wherein the recess structure includes a plurality of recess rings, each encircling the plurality of openings.

13. The photomask of claim 1, further comprising a capping layer disposed between the substrate and the conductive material layer, wherein capping layer is exposed in at least one of the plurality of openings.

14. The photomask of claim 1, wherein the substrate is exposed in at least one of the plurality of openings.

15. A photomask, comprising:
a substrate; and
a material layer disposed over the substrate and patterned to include a plurality of openings and a recess structure surrounding the plurality of openings, wherein a portion of the material layer is positioned directly under the recess structure such that the recess structure is separated from the substrate by the portion of the material layer.

16. The photomask of claim 15, wherein the plurality of openings defines an integrated circuit (IC) pattern.

17. The photomask of claim 16, wherein the recess structure includes a continuous recess that encircles the plurality of openings.

18. The photomask of claim 16, wherein the recess structure is extended to edges of the photomask.

19. A photomask, comprising:
a substrate; and
a material layer dispose over the substrate and patterned to include a plurality of openings and a recess structure surrounding the plurality of openings, wherein a portion of the material layer is positioned directly under the recess structure such that the recess structure is separated from the substrate by the portion of the material layer.

20. The photomask of claim 19, wherein the substrate is exposed in at least one of the plurality of openings.

* * * * *